United States Patent
Park et al.

(10) Patent No.: US 9,432,018 B2
(45) Date of Patent: Aug. 30, 2016

(54) STORAGE CONTROLLERS, METHODS OF OPERATING THE SAME AND SOLID STATE DISKS INCLUDING THE SAME

(71) Applicants: Kwang-Soo Park, Suwon-si (KR); Su-Jin Kim, Hwaseong-si (KR); Jung-Hee Cho, Seoul (KR)

(72) Inventors: Kwang-Soo Park, Suwon-si (KR); Su-Jin Kim, Hwaseong-si (KR); Jung-Hee Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/806,686

(22) Filed: Jul. 23, 2015

(65) Prior Publication Data

US 2016/0087630 A1 Mar. 24, 2016

(30) Foreign Application Priority Data

Sep. 22, 2014 (KR) .................. 10-2014-0125437

(51) Int. Cl.
*H03K 19/003* (2006.01)
*H03K 19/00* (2006.01)

(52) U.S. Cl.
CPC ...... *H03K 19/0005* (2013.01); *H03K 19/0013* (2013.01)

(58) Field of Classification Search
CPC .................. H03K 19/005; H03K 19/017545
USPC ........... 326/30, 82–83, 86–87; 327/108–109, 327/112; 365/193
See application file for complete search history.

(56) References Cited

U.S. PATENT DOCUMENTS

| | | | | |
|---|---|---|---|---|
| 7,161,378 B2 * | 1/2007 | Kang | ................ | H04L 25/0284 326/26 |
| 7,525,337 B2 * | 4/2009 | Park | .................. | G11C 5/063 326/30 |
| 7,671,622 B2 | 3/2010 | Oh et al. | | |
| 8,274,850 B2 | 9/2012 | Koshizuka | | |
| 8,581,621 B2 * | 11/2013 | Park | ............... | H03K 19/017509 326/26 |
| 8,688,955 B2 * | 4/2014 | Grunzke | .................. | G11C 5/00 710/107 |
| 8,907,698 B2 * | 12/2014 | Jung | ...................... | G11C 8/00 326/30 |
| 2005/0040845 A1 * | 2/2005 | Park | .................. | H03K 19/0005 326/30 |
| 2008/0001622 A1 | 1/2008 | You | | |
| 2008/0112233 A1 * | 5/2008 | Woo | ..................... | G11C 7/1045 365/189.05 |
| 2008/0164904 A1 | 7/2008 | Kim | | |
| 2009/0016124 A1 | 1/2009 | Kim | | |
| 2010/0061165 A1 * | 3/2010 | Cook | ................... | G11C 7/1051 365/193 |
| 2012/0113733 A1 * | 5/2012 | Kim | ...................... | G11C 5/063 365/193 |
| 2014/0003185 A1 | 1/2014 | Jung | | |
| 2014/0028345 A1 | 1/2014 | Oh et al. | | |
| 2014/0055162 A1 * | 2/2014 | Jung | ............. | H03K 19/017545 326/30 |
| 2015/0169235 A1 * | 6/2015 | Kang | ..................... | G06F 3/0619 711/103 |
| 2016/0036438 A1 * | 2/2016 | Kim | ...................... | G11C 5/063 365/193 |

FOREIGN PATENT DOCUMENTS

| | | |
|---|---|---|
| JP | 2009-070150 | 4/2009 |
| JP | 2011 060229 | 3/2011 |
| KR | 100744004 B1 | 7/2007 |
| KR | 1020080065794 A | 7/2008 |
| KR | 100853468 B1 | 8/2008 |
| KR | 1020120048750 A | 5/2012 |
| KR | 1020130072005 A | 7/2013 |

* cited by examiner

*Primary Examiner* — Jason M Crawford

(74) *Attorney, Agent, or Firm* — Myers Bigel & Sibley, P.A.

(57) ABSTRACT

A storage controller includes a first on-die termination (ODT) circuit, a second ODT circuit and an ODT control circuit. The first ODT circuit provides a first termination resistance with a strobe signal line transferring a data strobe signal. The second ODT circuit provides a second termination resistance with at least one data line transferring data. The ODT control circuit individually controls activation and deactivation of the first ODT circuit and the second ODT circuit.

17 Claims, 21 Drawing Sheets

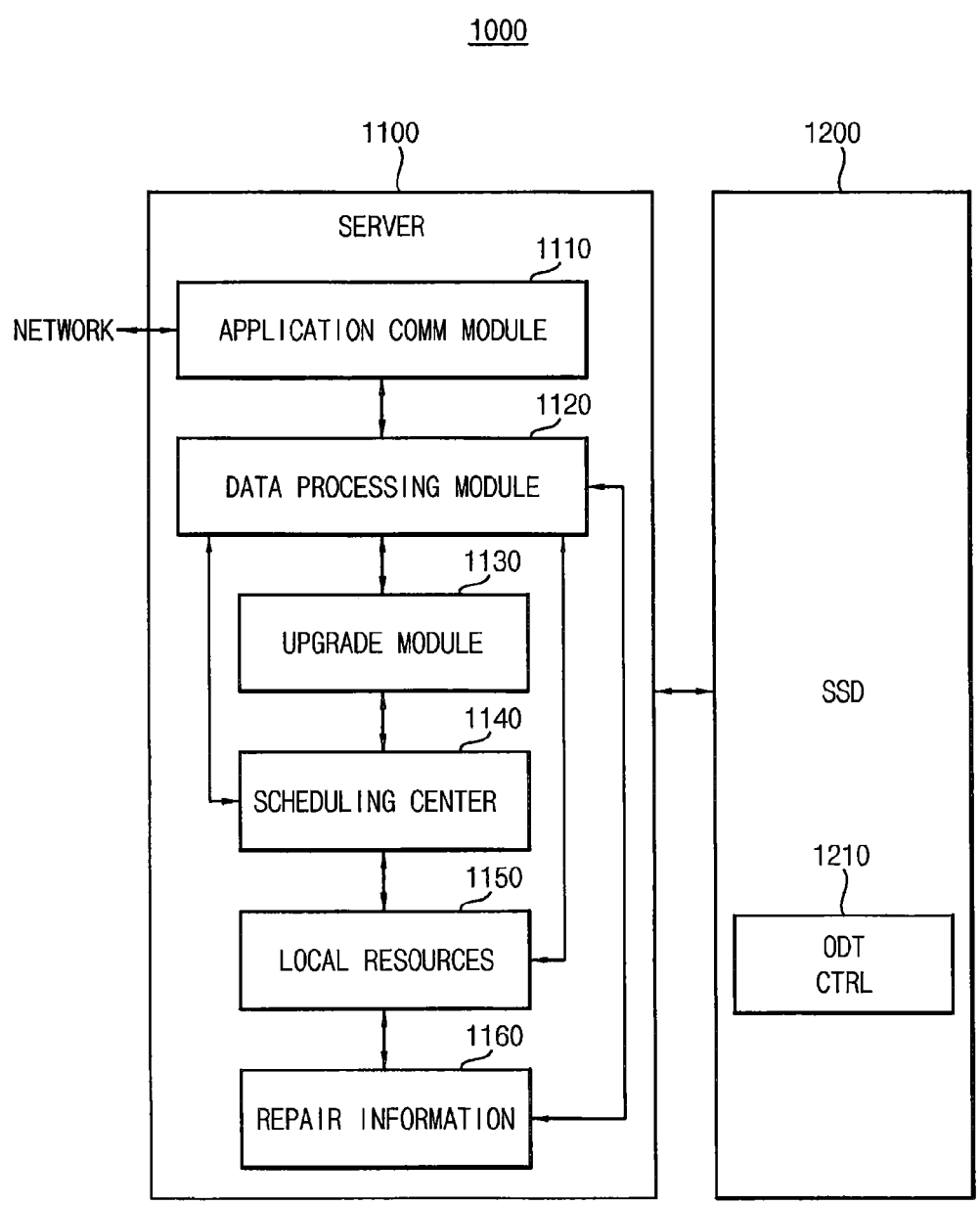

STORAGE CONTROLLERS, METHODS OF OPERATING THE SAME AND SOLID STATE DISKS INCLUDING THE SAME

CROSS-REFERENCE TO RELATED APPLICATION

This application claims priority under 35 USC §119 to Korean Patent Application No. 10-2014-0125437, filed on Sep. 22, 2014, in the Korean Intellectual Property Office (KIPO), the content of which is herein incorporated by reference in its entirety.

BACKGROUND

Semiconductor memory devices may be classified mainly into volatile memory devices and non-volatile memory devices. Write speed of volatile memory devices may be rapid, while contents stored therein may disappear at power-off. On the other hand, non-volatile memory devices may retain contents stored therein even at power-off. For this reason, non-volatile memory devices may be utilized to store contents to be retained regardless of whether power is supplied. In particular, as a type of non-volatile memory device, flash memory is applied to large-volume auxiliary memory devices because higher integration density may be achieved with flash memory than conventional electrically erasable programmable read-only memory (EEPROM).

Mobile circumstances may need high integration density, low-power and high-reliability non-volatile memory devices. Upon designing high-speed non-volatile memory devices, AC characteristics associated with the input and output of data/address/control may be addressed. AC characteristics may not be based on characteristics of integrated circuit devices or controllers for controlling integrated circuit devices, but instead may be based on characteristics of channels connecting two or more devices. Therefore, channel characteristics may be considered during high-speed integrated circuit device design.

An example of channel characteristic improvement includes the use of on-die termination (ODT) circuits or off-chip driver circuits. The impedance of signal lines can be adjusted via the ODT circuit.

SUMMARY

Some example embodiments provide a storage controller, capable of reducing power consumption.

Some example embodiments provide a solid state disk including a storage controller, capable of reducing power consumption.

Some example embodiments provide a method of operating a storage controller, capable of reducing power consumption.

According to some example embodiments, a storage controller includes a first on-die termination (ODT) circuit, a second ODT circuit and an ODT control circuit. The first ODT circuit provides a first termination resistance with a strobe signal line transferring a data strobe signal. The second ODT circuit provides a second termination resistance with at least one data line transferring data. The ODT control circuit individually controls activation and deactivation of the first ODT circuit and the second ODT circuit.

In some example embodiments, the ODT control circuit may activate the first ODT circuit and deactivate the second ODT circuit during a reception operation in which the storage controller receives the data from a nonvolatile memory device.

The ODT control circuit may provide a first ODT control signal to the first ODT circuit to activate the first ODT circuit and may provide a second ODT control signal to the second ODT circuit to deactivate the second ODT circuit, in response to a mode signal.

In some example embodiments, the storage controller may further include an I/O circuit that receives the data and the data strobe signal. The I/O circuit may determine a logic value of the data based on the data strobe signal.

The I/O circuit may be connected with the first ODT circuit via the strobe signal line and may be connected with the second ODT circuit via the at least one data line.

In some example embodiments, the first ODT circuit may include a plurality of first resistors connected in parallel to the strobe signal line, a plurality of pull-up switches, a plurality of second resistors connected in parallel to the strobe signal line and a plurality of pull-down switches. Each of the pull-up switches may be connected between each of the first resistors and a power supply voltage. Each of the pull-down switches may be connected between each of the second resistors and a ground voltage.

When the ODT control circuit activates the first ODT circuit, the pull-up switches and the pull-down switches may receive first ODT control codes that are set in response to a first ODT control signal.

In some example embodiments, the second ODT circuit may include a plurality of first resistors connected in parallel to the at least one data line, a plurality of pull-up switches, a plurality of second resistors connected in parallel to the at least one data line and a plurality of pull-down switches. Each of the pull-up switches may be connected between each of the first resistors and a power supply voltage. Each of the pull-down switches may be connected between each of the second resistors and a ground voltage.

When the ODT control circuit deactivates the second ODT circuit, the pull-up switches and the pull-down switches may be turned off in response to a second ODT control signal.

In some example embodiments, the ODT control circuit may control the first ODT circuit and the second ODT circuit such that a first voltage swing range of the data strobe signal is different from a second voltage swing range of the data.

According to some example embodiments, a storage controller includes and I/O circuit, an ODT circuit, and an ODT control circuit. The I/O circuit receives data and a data strobe signal. The ODT circuit is connected to the I/O circuit and provides a termination resistance with a strobe signal line transferring a data strobe signal. The ODT control circuit controls activation of the ODT circuit. The ODT control circuit activates the ODT circuit only during a reception operation in which the storage controller receives the data from a nonvolatile memory device.

According to some example embodiments, a solid state disk (SSD) includes a plurality of nonvolatile devices that store data and a storage controller. The storage controller controls the plurality of nonvolatile devices. The storage controller includes a first on-die termination (ODT) circuit, a second ODT circuit and an ODT control circuit. The first ODT circuit provides a first termination resistance with a strobe signal line transferring a data strobe signal. The second ODT circuit provides a second termination resistance with at least one data line transferring data. The ODT control circuit individually controls activation and deactivation of the first ODT circuit and the second ODT circuit.

In some example embodiments, the ODT control circuit may activate the first ODT circuit and deactivates the second ODT circuit during a reception operation in which the storage controller receives the data from the nonvolatile memory devices.

In some example embodiments, the storage controller may exchange the data strobe signal via a first channel and the data via a second channel and with one of the nonvolatile memory devices.

Each of the first channel and the second channel may provide a single-ended signaling interface.

The storage controller may include a first receiver and a second receiver. The first receiver may include the first ODT circuit, and the first receiver may receive the data strobe signal from the first channel. The second receiver may include the second ODT circuit, and the second receiver may receive the data from the second channel. The ODT control circuits may activate the first ODT circuit and deactivate the second ODT circuits during a reception operation in which the storage controller receives the data from the nonvolatile memory devices.

Each of the first channel and the second channel may provide a differential signaling interface.

The storage controller may include a first receiver and a second receiver. The first receiver may include the first ODT circuit, and the first receiver may receive the data strobe signal from the first channel. The second receiver may include the second ODT circuit, and the second receiver may receive the data from the second channel. The ODT control circuits may activate the first ODT circuit and deactivate the second ODT circuits during a reception operation in which the storage controller receives the data from the nonvolatile memory devices.

In some example embodiments, each of the nonvolatile memory devices may be a NAND flash memory. At least one of the nonvolatile memory devices may include a three-dimensional memory array.

In some example embodiments, the storage controller may be formed in a first layer and the nonvolatile memory devices may be formed in a second layer stacked on the first layer.

In some example embodiments, the storage controller may further include an input/output (I/O) circuit. The I/O circuit may receive the data strobe signal and the data, wherein the I/O circuit is connected to the strobe signal line and the at least one data line.

According to some example embodiments, a method of operating a storage controller includes receiving data and data strobe signal from at least one nonvolatile memory device and controlling, by an on-die termination (ODT) control circuit, activation and deactivation of the a first ODT circuit and a second ODT circuit individually. The first ODT circuit is associated with the data strobe signal and the second ODT circuit is associated with the data.

In some example embodiments, controlling the activation and the deactivation individually may include activating the first ODT circuit while deactivating the second ODT circuit by providing a first ODT control signal to the first ODT circuit and providing a second ODT control signal to the second ODT circuit by the ODT control circuit in response to a mode signal during a reception operation in which the storage controller receives the data from the nonvolatile memory devices.

The first ODT circuit may be activated in response to the first ODT control signal to provide a termination resistance to a strobe signal line transferring the data strobe signal and the second ODT circuit may be deactivated in response to the second ODT control signal.

In some example embodiments, the ODT control circuit may control the first ODT circuit and the second ODT circuit such that a first voltage swing range of the data strobe signal is different from a second voltage swing range of the data.

Accordingly, the storage controller may reduce power consumption in data reception operation when receiving data and data strobe signal from the nonvolatile memory devices by activating a first ODT circuit that provides a termination resistance to a strobe signal line transferring the data strobe signal and deactivating a second ODT circuit that provides a termination resistance to a data line transferring the data.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

Illustrative, non-limiting example embodiments will be more clearly understood from the following detailed description taken in conjunction with the accompanying drawings.

FIG. 28 is a block diagram illustrating an example of a server system that employs the SSD according to some example embodiments.

DETAILED DESCRIPTION

Figure 1:
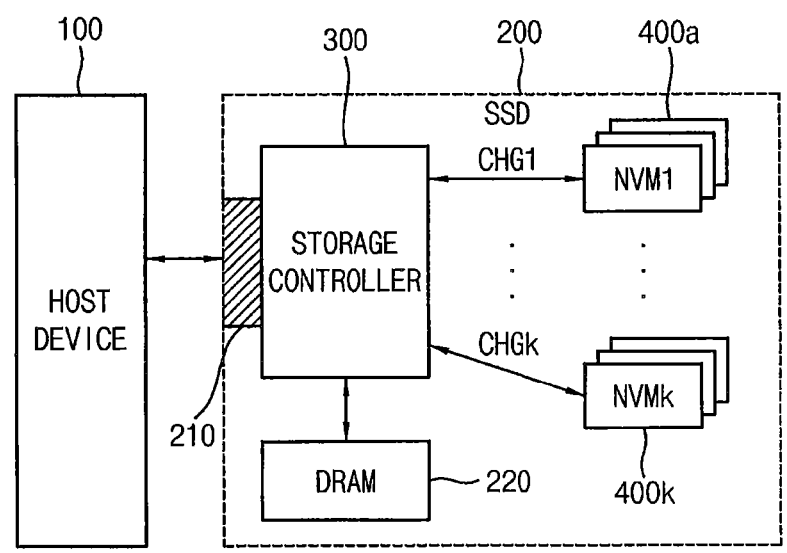
FIG. 1 is a block diagram illustrating a storage system according to some example embodiments.

Various embodiments of the inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete and will fully convey the scope of the inventive concept to those skilled in the art. Throughout the written description and drawings, like reference numbers refer to like or similar elements and features.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of devices may be arranged in an array and/or in a two-dimensional pattern.

Hereinafter, some example embodiments will be described with reference to accompanying drawings. The same reference numerals will be used to refer to the same elements throughout the drawings and detailed description about the same elements will be omitted in order to avoid redundancy.

FIG. 1 is a block diagram illustrating a storage system according to some example embodiments. Referring to FIG. 1, a storage system 10 may include a host device 100 and a solid state disk (SSD) 200.

The host device 100 may control overall operation of the SSD 200. The host device 100 may exchange signals with SSD 200. The signals exchanged between the host device 100 and the SSD 200 may include a command, an address, data, etc.

The SSD 200 may include a storage controller 300, a dynamic random access memory (DRAM) 220, a pad 210 and a plurality of nonvolatile memory devices 400a~400k. Each of the plurality of nonvolatile memory devices 400a~400k may be implemented with a NAND flash memory.

The storage controller 300 may exchange the signals such as a command, an address, data, etc. with the host device 100. The storage controller 300 may write data in a corresponding nonvolatile memory device and may read data from a corresponding nonvolatile memory device according to a command.

The DRAM 220 may be used as a buffer area temporarily storing data received from the host device 100 or temporarily storing data read from the nonvolatile memory devices 400a~400k. The DRAM 220 may also be used to drive a software used for an effective management of the nonvolatile memory devices 400a~400k. The DRAM 220 may be used to store meta data received from the host device 100 and/or may be used to store cache data. In some other embodiments, the SSD 120 may be embodied by replacing the DRAM with volatile memories such as SRAM, etc. or replacing each of the nonvolatile memory devices 400a~400k with nonvolatile memory device such as Phase Change Random Access Memory (PRAM), Resistance Random Access Memory (RRAM), Magneto-resistive Random Access Memory (MRAM), Ferroelectric random access memory (FRAM), etc.

The plurality of nonvolatile memory devices 400a~400k may be used as a storage medium of the SSD 200. The plurality of nonvolatile memory devices 400a~400k may be connected to the storage controller 300 through a plurality of channel groups CHG1~CHGk. Each of the channel groups CHG1~CHGk may include at least one channel. One or more nonvolatile memory devices may be connected to one channel group. A nonvolatile memory device connected to one channel group may be connected to the same data bus. In some other embodiments, the SSD 200 may be embodied to use nonvolatile memories such as PRAM, MRAM, RRAM, FRAM, etc. as a storage medium in place of NAND flash memory.

The SSD 200 may further include the pad 210 to be connected to the host device 100. The SSD 200 can be easily attached to or detached from the host device 100 through the pad 210. The pad 210 may be formed inside the SSD 200 as illustrated in FIG. 1 or may be formed in the form of connector outside the SSD 200. In some embodiments, the SSD 200 may not include the pad 210 and may be connected to the host device 100 through a routing process.

Figure 2:
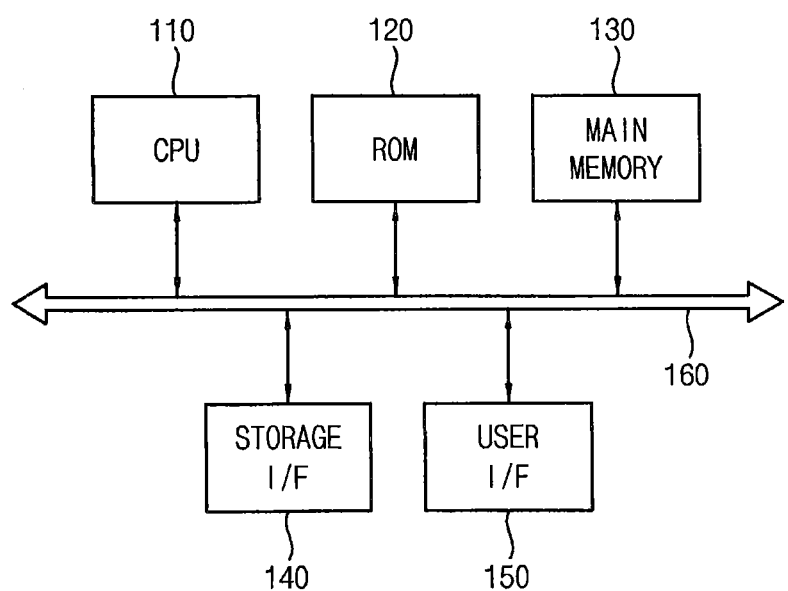
FIG. 2 is a block diagram illustrating the hose device in FIG. 1 according to some example embodiments.

FIG. 2 is a block diagram illustrating the host device in FIG. 1 according to some example embodiments. Referring to FIG. 2, the host device 100 may include a central processing unit (CPU) 110, a read-only memory (ROM) 120, a main memory 130, a storage interface 140, a user interface 150 and a bus 160.

The bus 160 may refer to a transmission channel via which data is transmitted between the CPU 110, the ROM 120, the main memory 130, the storage interface 140 and the user interface 150 of the host device 100.

The ROM 120 may store various application programs. For example, application programs supporting storage protocols such as Advanced Technology Attachment (ATA), Small Computer System Interface (SCSI), embedded Multi Media Card (eMMC), and/or Unix File System (UFS) protocols are stored.

The main memory 130 may temporarily store data or programs.

The storage interface 140 may include an interface supporting a storage protocol, e.g., an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small Computer System (SAS) interface, a Small Computer System Interface (SCSI), an embedded Multi Media Card (eMMC) interface, and/or a Unix File System (UFS) interface.

The user interface 150 may be a physical or virtual medium for exchanging information between a user and the host device 100, a computer program, etc., and includes physical hardware and logical software. For example, the user interface 150 may include an input device for allowing the user to manipulate the host device 100, and an output device for outputting a result of processing an input of the user.

The CPU 110 may control overall operations of the host device 100. The CPU 110 may generate a command for storing data in the SSD 200 or a request (or a command) for reading data from the SSD 200 by using an application stored in the ROM 120, and transmit the request to the SSD 200 via the storage interface 140.

Figure 3:
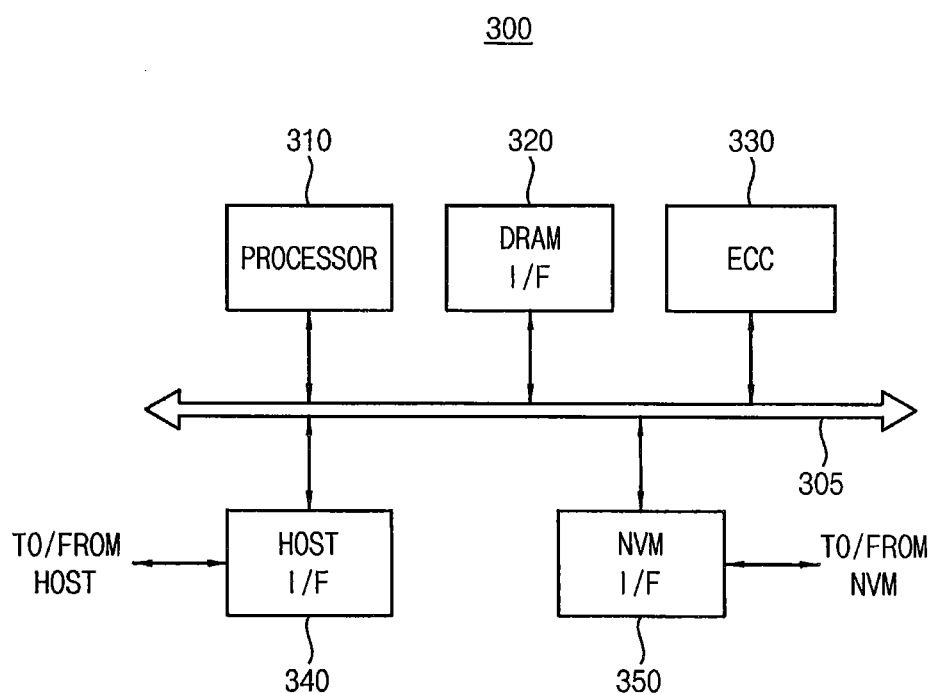
FIG. 3 is a block diagram illustrating an example of the storage controller in FIG. 1 according to some example embodiments.

FIG. 3 is a block diagram illustrating an example of the storage controller in FIG. 1 according to some example embodiments. Referring to FIG. 3, the storage controller 300 may include a processor 310, a DRAM interface 320, an error correction code (ECC) block 330, a host interface 340, a nonvolatile memory interface (also referred to as a flash interface) 350, and a bus 305.

The bus 305 may refer to a transmission channel via which data is transmitted between the processor 310, the DRAM interface 320, the ECC block 330, the host interface 340 and flash interface 350 of the storage controller 300. The processor 310 may perform operation for data exchange between the host device 100 and the nonvolatile memory devices 400a~400k.

The host interface 340 may include a protocol for exchanging data with the host device 100 that accesses the nonvolatile memory devices 400a~400k, and connect nonvolatile memory devices 400a~400k and the host device 100 to each other. The host interface 340 may be implemented using, but not limited to, an Advanced Technology Attachment (ATA) interface, a Serial Advanced Technology Attachment (SATA) interface, a Parallel Advanced Technology Attachment (PATA) interface, a Universal Serial Bus (USB) or Serial Attached Small Computer System (SAS) interface, a Small Computer System Interface (SCSI), an embedded Multi Media Card (eMMC) interface, and/or a Unix File System (UFS) interface. The processor 310 may communicate with the nonvolatile memory devices 400a~400k through flash interface 350.

The DRAM interface 320 may be connected to the DRAM 220. The processor 310 may communicate with the DRAM 220 through DRAM interface 320.

The ECC block 330 may generate an error correction code (ECC) for data which is received from the host device 100 using various algorithms during a write operation. During a read operation, the ECC block 330 may perform error detection and error correction on data read from the nonvolatile memory devices 400a~400k to provide the data to the host device 100. The ECC block 330 may perform ECC encoding and ECC decoding using various code.

The storage controller 300 may be built-in in one of the nonvolatile memory devices 400a~400k, and the storage controller 300 and the nonvolatile memory devices 400a~400k may be fabricated as separate chips. The ECC block 330 may be included in the nonvolatile memory devices 400a~400k for reducing amount of data transmission between the nonvolatile memory devices 400a~400k and the storage controller 300.

The nonvolatile memory devices 400a~400k, the storage controller 300 and/or the SSD 200 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), and/or wafer-level processed stack package (WSP).

Figure 4:
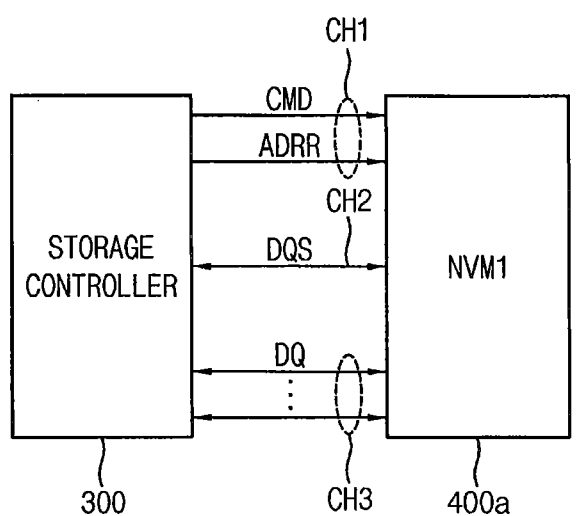
FIG. 4 illustrates a connection of the storage controller and one of the nonvolatile memory devices in a solid state disk (SSD) in FIG. 1 according to some example embodiments.

FIG. 4 illustrates a connection of the storage controller and one of the nonvolatile memory devices in SSD of FIG. 1 according to some example embodiments. Referring to FIG. 4, the storage controller 300 may be connected to the nonvolatile memory device 400a through a plurality of channels CH1, CH2 and CH3. The storage controller 300 may transmit a command CMD and address ADDR to the nonvolatile memory device 400a through the channel, may exchange a data strobe signal DQS with the nonvolatile memory device 400a through the channel CH2 and may exchange data DQ with the nonvolatile memory device 400a through the channel CH2.

Figure 5:
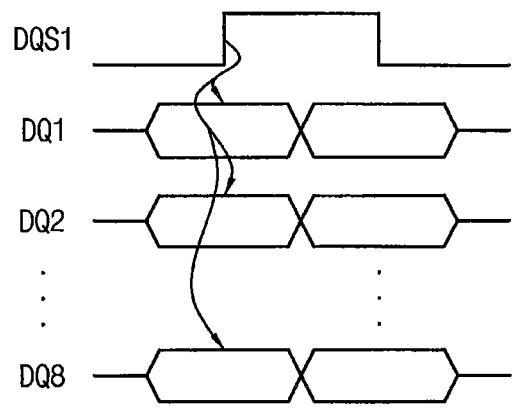
FIG. 5 illustrates a relationship between the data strobe signal and the data in FIG. 4.

FIG. 5 illustrates a relationship between the data strobe signal and the data in FIG. 4. Referring to FIG. 5, the storage controller 300 may receive 8-bit data DQ1~DQ8 in response to one data strobe signal DQS1. The data strobe signal DQS1 may provide a reference time point for determining each logic level of the 8-bit data DQ1~DQ8. When data are exchanged with very high speed, the data strobe signal DQS1 may provide accurate reference time for determining each logic level of the 8-bit data DQ1~DQ8. In FIG. 5, it is illustrated that each logic level of the 8-bit data DQ1~DQ8 is determined when the data strobe signal DQS1 is enabled with a logic high level. In some embodiments, each logic level of the 8-bit data DQ1~DQ8 may be determined when the data strobe signal DQS1 is enabled with a logic low level.

Figure 6:
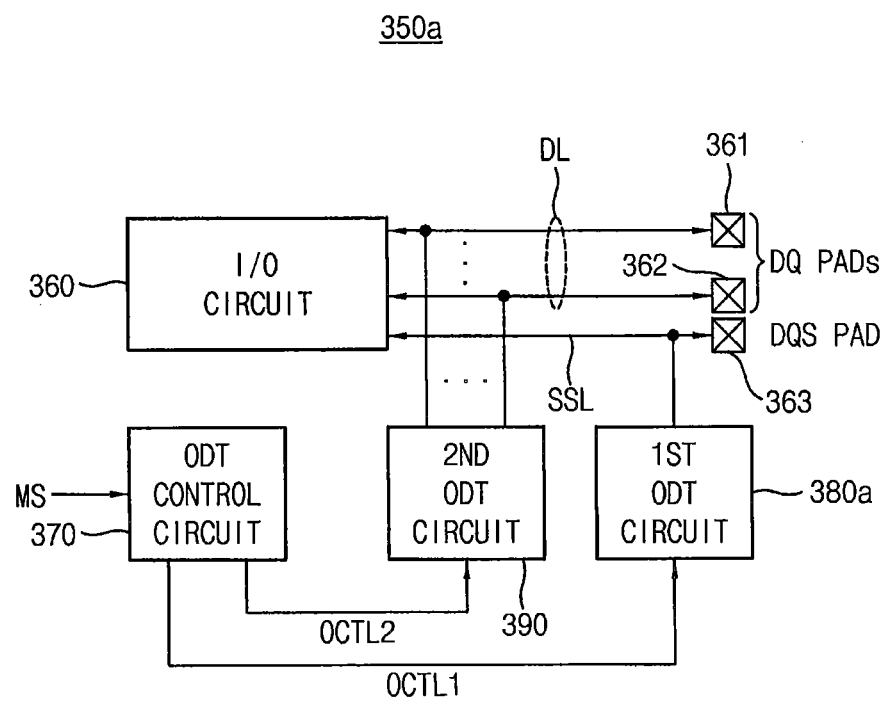
FIG. 6 is a block diagram illustrating an example of the flash interface in FIG. 3 according to some example embodiments.

FIG. 6 is a block diagram illustrating an example of the flash interface in FIG. 3 according to some example embodiments. Referring to FIG. 6, a flash interface 350a may include an input/output (I/O) circuit 360, an on-die termination (ODT) control circuit 370, a first ODT circuit 380a and a second ODT circuit 390.

The I/O circuit 360 may transmit or receive the data DQ and data strobe signal DQS. The I/O circuit 360 is connected to data pads 361 and 362 through at least one data line DL, via which the data DQ are input and output. The I/O circuit 360 is connected to a strobe pad 363 through a strobe signal lien SSL, via which the data strobe signal DQS is input and output.

The first ODT circuit 380a is connected to the strobe signal line SSL transferring the strobe signal DQS and provides the strobe signal line SSL with a termination resistance. The second ODT circuit 390 is connected to the at least one data line DL transferring the data DQ and provides the at least one data line DL with a termination resistance.

The ODT control circuit 370 may generate a first ODT controls signal OCTL1 for controlling the first ODT circuit 380a and a second ODT control signal OCTL2 for controlling the second ODT circuit 390, in response to the mode signal MS. The ODT control circuit 370 may provide the first ODT control signal OCTL1 to the first ODT circuit 380a and may provide the second ODT control signal OCTL2 to the second ODT circuit 390. The ODT control circuit 370 may activate the first ODT circuit 380a and deactivate the second ODT circuit 390 during a reception operation in which the storage controller 300 receives the data DQ from the nonvolatile memory device 400a.

Therefore, the first ODT circuit 380a provides the termination resistance to the strobe signal line SSL and the second ODT circuit 390 does not provide the termination resistance to the at least one data line DL during the reception operation. Therefore, a first voltage swing range of the data strobe signal DQS that the I/O circuit 360 receives may be smaller than a second voltage swing range of the data DQ that the I/O circuit 360 receives. That is, the ODT control circuit 370 may control the first ODT circuit 380a and the second ODT circuit 390 such that the first voltage swing range is different from the second voltage swing range during the reception operation. Accordingly, the storage controller 300 may increase credibility of the data strobe signal DQS and may greatly reduce power consumption that may occur when the termination resistance is provide to the data line DL by activating the first ODT circuit 380a associated with the data strobe signal DQS that is important for determining the data DQ and deactivating the second ODT circuit 390 associated with the data DQ.

The I/O circuit 360 receives the data strobe signal DQS and the data DQ having different voltage swing range and determines the logic level of the data DQ based on the data strobe signal DQS.

In FIG. 6, it is illustrated that the ODT control circuit 370, the first ODT circuit 380a and the second ODT circuit 390 are included in the flash interface 350a. However, in some embodiments, the ODT control circuit 370, the first ODT circuit 380a and the second ODT circuit 390 may be located in positions where the channels CH2 and CH3 are connected.

Figure 7:
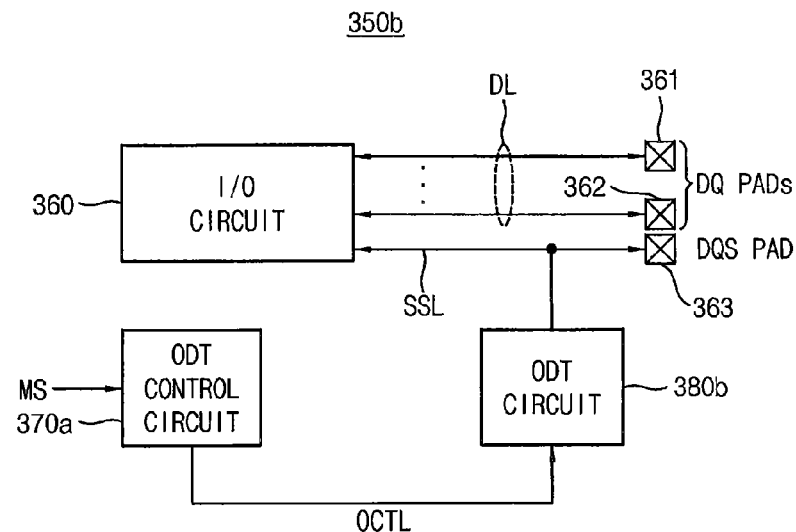
FIG. 7 is a block diagram illustrating another example of the flash interface in FIG. 3 according to some example embodiments.

FIG. 7 is a block diagram illustrating another example of the flash interface in FIG. 3 according to some example embodiments. Referring to FIG. 7, a flash interface 350b may include an input/output (I/O) circuit 360, an on-die termination (ODT) control circuit 370a, and an ODT circuit 380b. The ODT control circuit 370a may generate an ODT controls signal OCTL for controlling the ODT circuit 380b in response to the mode signal MS. The ODT control circuit 370a may provide the ODT control signal OCTL to the ODT circuit 380b. The ODT circuit 380b may provide the strobe signal line SSL with a corresponding termination resistance in response to the ODT control signal OCTL.

The ODT circuit 380b is connected to the strobe signal line SSL transferring the strobe signal DQS and provides the strobe signal line SSL with a termination resistance.

The flash interface 350b does not include an ODT circuit that provides a termination resistance to the at least one data line DL.

Figure 8:
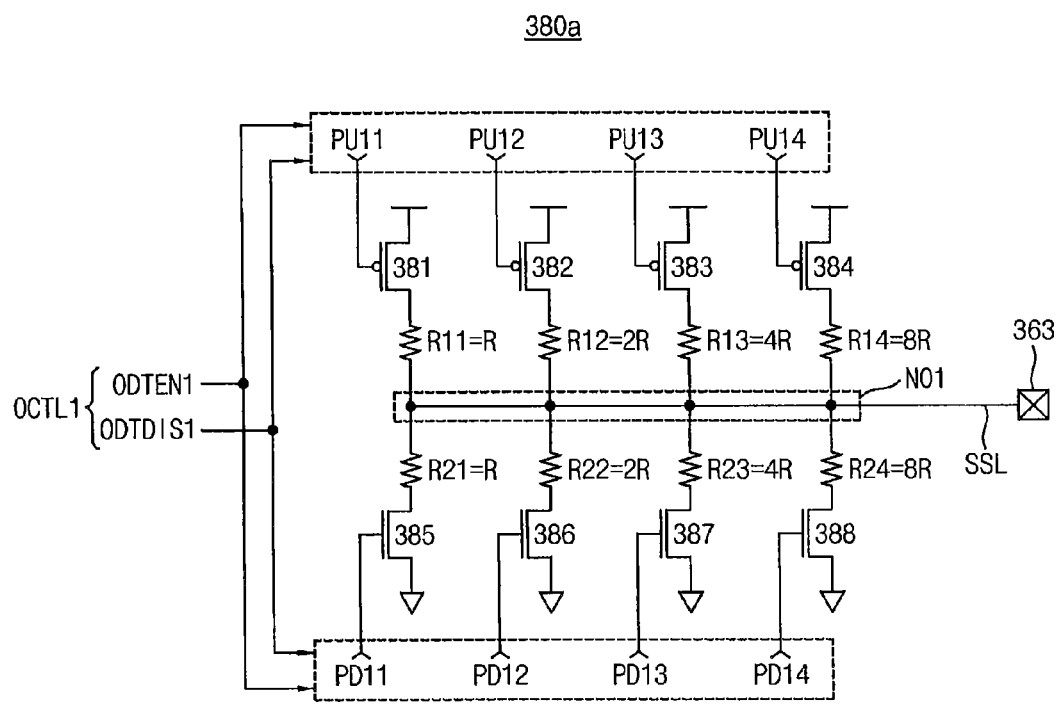
FIG. 8 is a circuit diagram illustrating the first ODT circuit in FIG. 6 according to some example embodiments.

FIG. 8 is a circuit diagram illustrating the first ODT circuit in FIG. 6 according to some example embodiments. Referring to FIG. 8, the first ODT circuit 380a may include a plurality of first resistors R11~R14, a plurality of pull-up switches 381~384, a plurality of second resistors R21~R24 and a plurality of pull-down switches 385~388. The first resistors R11~R14 are connected in parallel to a first node NO1 coupled to the strobe signal line SSL and each of the pull-up switches 381~384 is coupled between a power supply voltage VDD and each of the first resistors R11~R14. The second resistors R21~R24 are connected in parallel to the first node NO1 and each of the of pull-down switches 385~388 is coupled between each of the second resistors R21~R24 and a ground voltage. The first resistors R11~R14 may have corresponding resistance of R, 2R, 4R and 8R respectively, and the second resistors R21~R24 may have corresponding resistance of R, 2R, 4R and 8R respectively. Each of the pull-up switches 381~384 may be implemented with a p-channel metal-oxide semiconductor (PMOS) transistor and each of the pull-down switches 385~388 may be implemented with an n-channel metal-oxide semiconductor (NMOS) transistor.

When an ODT enable signal ODTEN1 is activated in response to the first ODT control signal ODT1 in the reception operation in which the data DQ is received, preset ODT control codes PU11~PU14 are provided to the pull-up switches 381~384 and the first resistors R11~R14 are set to have corresponding resistances. When the ODT enable signal ODTEN1 is activated in response to the first ODT control signal ODT1 in the reception operation, preset ODT control codes PD11~PD14 are provided to the pull-down switches 385~388 and the second resistors R21~R24 are set to have corresponding resistances.

When an ODT disable signal ODTDIS1 is activated in response to the first ODT control signal ODT1 in other operations except the reception operation, the ODT control codes PU11~PU14 are blocked to the pull-up switches 381~384 and the ODT control codes PD11~PD14 are blocked to the pull-down switches 385~388.

When the ODT control codes PU11~PU14 are provided to the pull-up switches 381~384 and the ODT control codes PD11~PD14 are provided to the pull-down switches 385~388 in the reception operation, corresponding termination resistance is provided to the strobe signal line SSL and a voltage swing range of the strobe signal DQS in the strobe signal line SSL may be more reduced than in the channel CH2.

Figure 9:
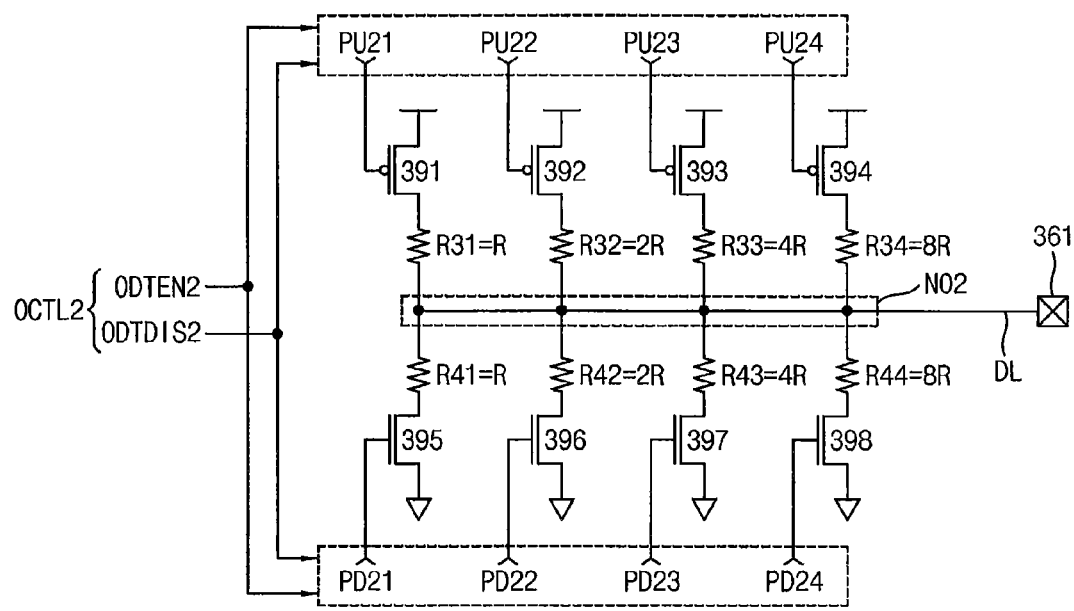
FIG. 9 is a circuit diagram illustrating the second ODT circuit in FIG. 6 according to example embodiments.

FIG. 9 is a circuit diagram illustrating the second ODT circuit in FIG. 6 according to some example embodiments. Referring to FIG. 9, the second ODT circuit 390 may include a plurality of first resistors R31~R34, a plurality of pull-up switches 391~394, a plurality of second resistors R41~R44 and a plurality of pull-down switches 395~398. The first resistors R31~R34 are connected in parallel to a second node NO2 coupled to the at least one data line DL and each of the pull-up switches 391~394 is coupled between a power supply voltage VDD and each of the first resistors R31~R34. The second resistors R41~R44 are connected in parallel to the second node NO2 and each of the of pull-down switches 395~398 is coupled between each of the second resistors R41~R44 and a ground voltage. The first resistors R31~R34 may have corresponding resistance of R, 2R, 4R and 8R respectively, and the second resistors R41~R44 may have corresponding resistance of R, 2R, 4R and 8R respectively. Each of the pull-up switches 391~394 may be implemented with a PMOS transistor and each of the pull-down switches 395~398 may be implemented with an NMOS transistor.

When an ODT enable signal ODTEN2 is activated in response to the second ODT control signal ODT2 in the reception operation in which the data DQ is received, preset ODT control codes PU21~PU24 are provided to the pull-up switches 391~394 and the pull-up switches 391~394 are opened. When the ODT enable signal ODTEN2 is activated in response to the second ODT control signal ODT2 in the reception operation, preset ODT control codes PD21~PD24 are provided to the pull-down switches 395~398 and pull-down switches 395~398 are opened. When the pull-up switches 391~394 and the pull-down switches 395~398 are opened in response to the second ODT control signal OCTL2, current paths between the power supply voltage VDD and the ground voltage in the second ODT circuit 390 are blocked and power consumption that may occur in the reception operation may be reduced. In addition, when the pull-up switches 391~394 and the pull-down switches 395~398 are opened in response to the second ODT control signal OCTL2, the termination resistance is not provided to the at least one data line DL, and thus, a voltage swing range of the data in the at least one data line DL may be substantially the same as in the channel CH3.

In operations other than the reception operation, the ODT enable signal ODTEN2 is enabled in response to the second ODT control signal OCTL2, preset termination resistance may be provided to the at least one data line DL.

Figure 10:
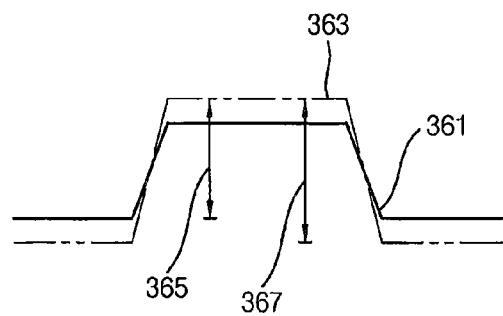
FIG. 10 illustrates voltages of the data strobe signal and the data in data reception operation according to some example embodiments.

FIG. 10 illustrates voltages of the data strobe signal and the data in data reception operation according to some example embodiments. In FIG. 10, a reference numeral 361 denotes a voltage of the data strobe signal DQS and a reference numeral 363 denotes a voltage of the data DQ in data reception operation.

Referring to FIG. 10, the ODT control circuit 370 activates the first ODT circuit 380a and deactivates the second ODT circuit 390 in the reception operation when the storage controller 300 receives the data DQ from the nonvolatile memory device 400a as described with reference to FIGS. 6,8 and 9. The first ODT circuit 380a provides the preset termination resistance to the strobe signal line SSL and the second ODT circuit 390 does not provide a termination resistance to the data line DL. Therefore, a first voltage swing range 365 of the data strobe signal DQS provided to the I/O circuit 370 through the strobe signal line SSL may be different from a second voltage swing range 367 of the data DQ provided to the I/O circuit 370 through the data line DL. The first voltage swing range 365 of the data strobe signal DQS may be smaller than the second voltage swing range 367 of the data DQ because of the termination resistance in the strobe signal line SSL.

Figure 11:
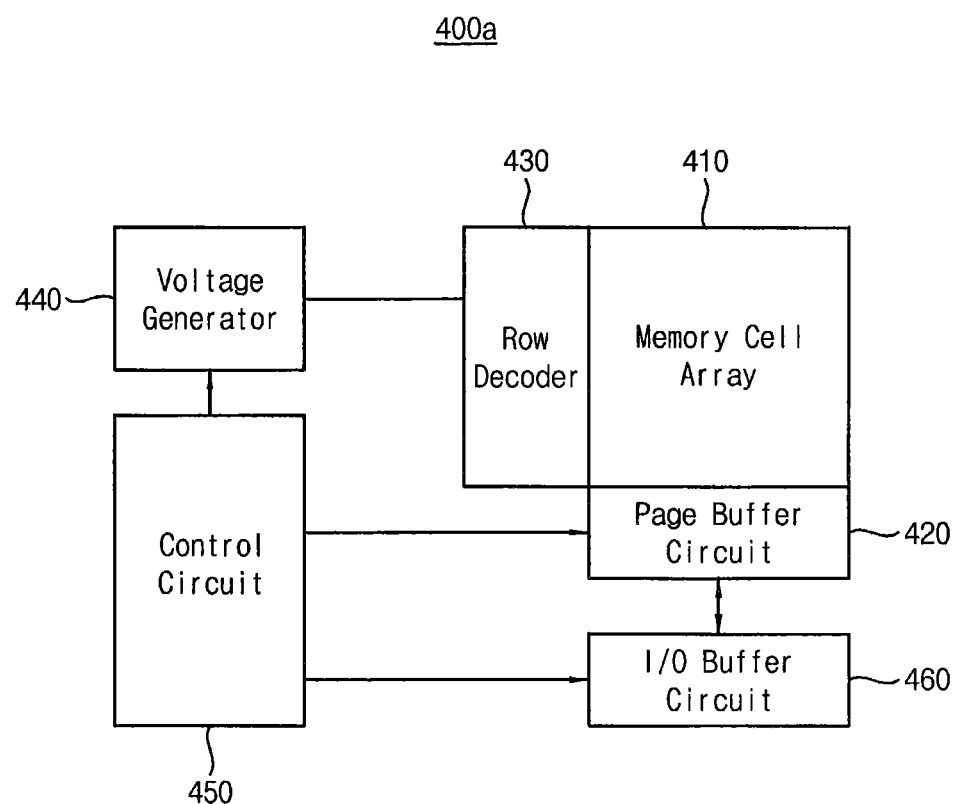
FIG. 11 is a block diagram illustrating an example of the nonvolatile memory device in FIG. 4 according to some example embodiments.

FIG. 11 is a block diagram illustrating an example of the nonvolatile memory device in FIG. 4 according to some example embodiments. Referring to FIG. 11, the nonvolatile memory device 400a may include a memory cell array 410, a page buffer circuit 420, a row decoder 430, a voltage generator 440, a control circuit 450 and an input/output (I/O) buffer circuit 460. The nonvolatile memory device 400a may be implemented by flash memory device. The nonvolatile memory device 400a may be implemented by PRAM, FRAM, RRAM, MRAM, etc.

The memory cell array 410 includes a plurality of memory cells connected to a plurality of word lines and a plurality of bit lines. As will be described below with reference to FIGS. 12 to 15, each of the memory cells may include a NAND flash memory cell, NOR flash memory cell or resistive memory cell. The memory cells may be arranged in a two-dimensional array structure and/or a three-dimensional array structure.

In some example embodiments, each of the memory cells may include a single level memory cell (SLC) for storing one data bit and a multi-level memory cell (MLC) for storing a plurality data bits. In a case of the MLC, a program scheme in a write mode may include various program schemes such as a shadow program scheme, a reprogram scheme, or an on-chip buffered program scheme.

The page buffer circuit 420 is connected to the bit-lines and is controlled by the control circuit 450 and serves as a sense amplifier or a write driver according an operation mode. For example, during a read operation, the page buffer circuit 420 operates as the sense amplifier for sensing data from memory cells in a selected row. During a program operation, the page buffer circuit 420 may operate as a write driver for driving memory cells in a selected row according to program data.

The I/O buffer circuit 460 receives write data from the storage controller 200 and transmits read data from the memory cell array 410 to the storage controller 200. The I/O buffer circuit 460 may include an ODT control circuit, a first ODT circuit and a second ODT circuit as illustrated in FIG. 6. The first ODT circuit is connected to a strobe signal line transferring a strobe signal and provides the strobe signal line with a termination resistance. The second ODT circuit is connected to a data line transferring the data and provides the data line with a termination resistance. The ODT control circuit may activate the first and second ODT circuits in write operation when the data is written in the memory cell array 410.

The row decoder 430 is connected to the word-lines and may select at least one of the word-lines in response to a row address. The voltage generator 440 may generate word-line voltages such as a program voltage, a pass voltage, a verification voltage, an erase voltage and a read-out voltage according to a control of the control circuit 450. The control circuit 450 may control the page buffer circuit 420, the row decoder 430 and the voltage generator 440 and the I/O buffer circuit 460.

In some embodiments, a three dimensional (3D) memory array is provided in the memory cell array 410. The 3D memory array may be monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

The 3D memory array includes vertical NAND strings that are vertically oriented such that at least one memory cell is located over another memory cell. The at least one memory cell may comprise a charge trap layer.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 12:
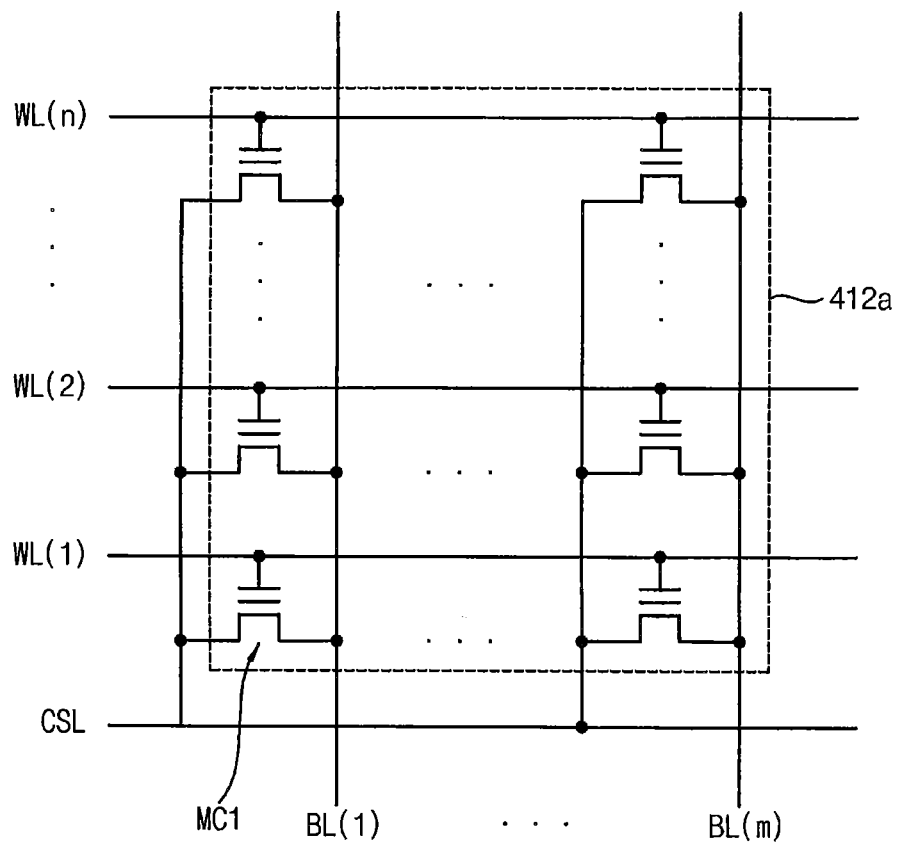
FIGS. 12 through 15 are diagrams illustrating examples of memory cell arrays that might be incorporated in the nonvolatile memory device of FIG. 11.
Figure 13:
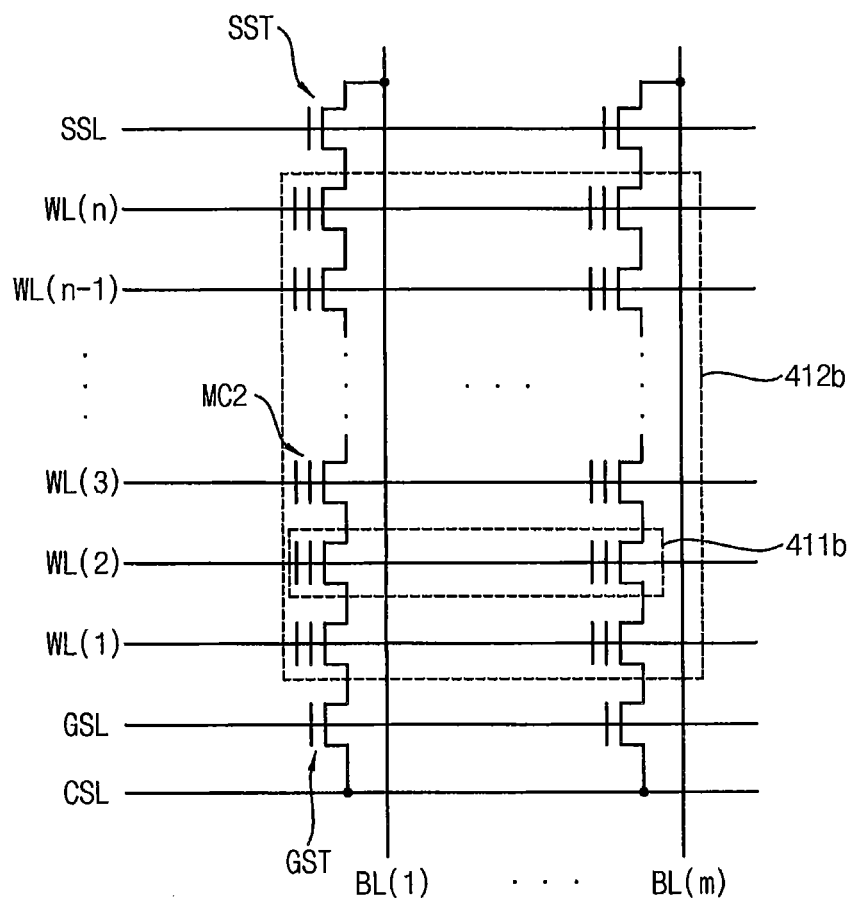
Figure 14:
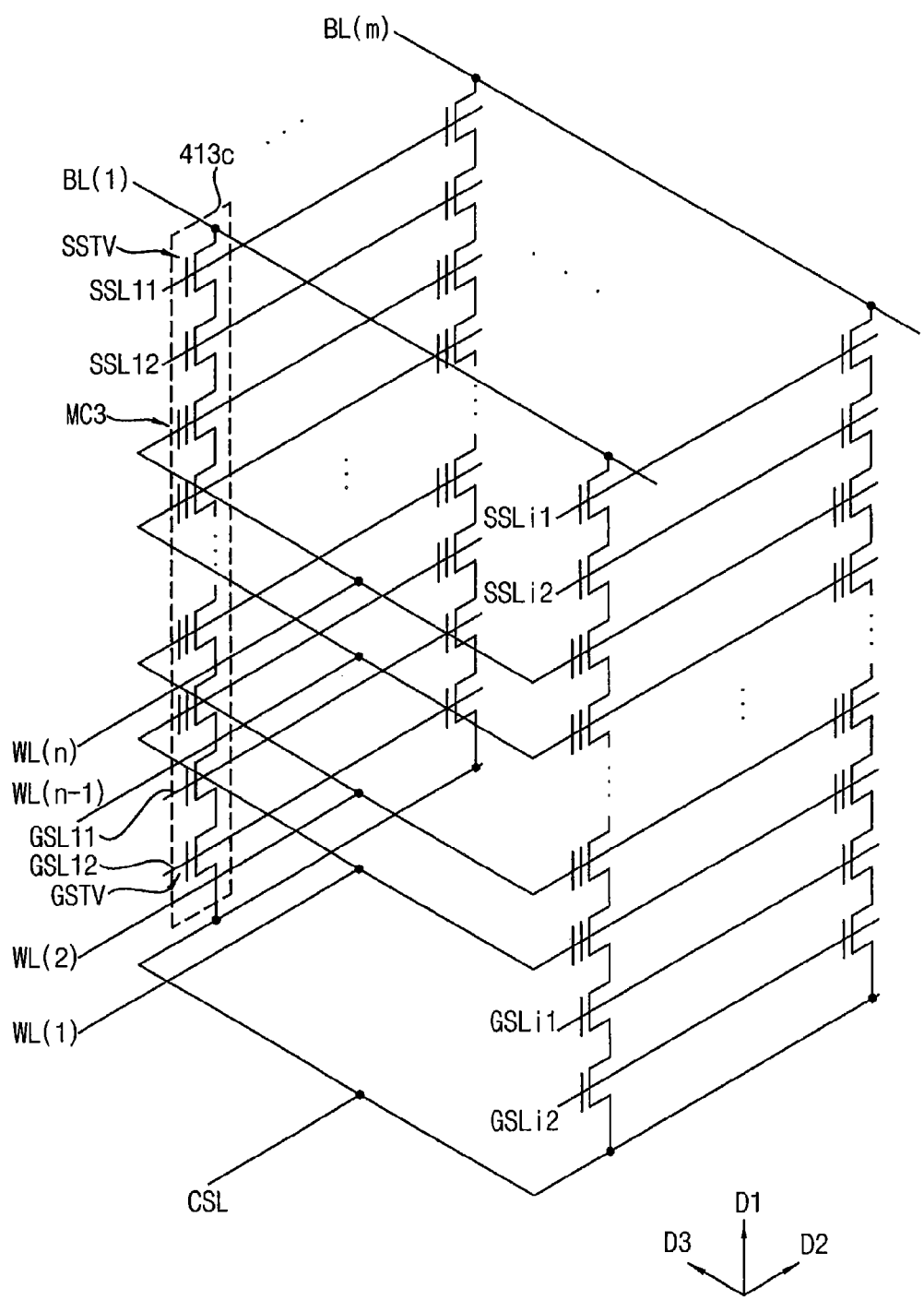
Figure 15:
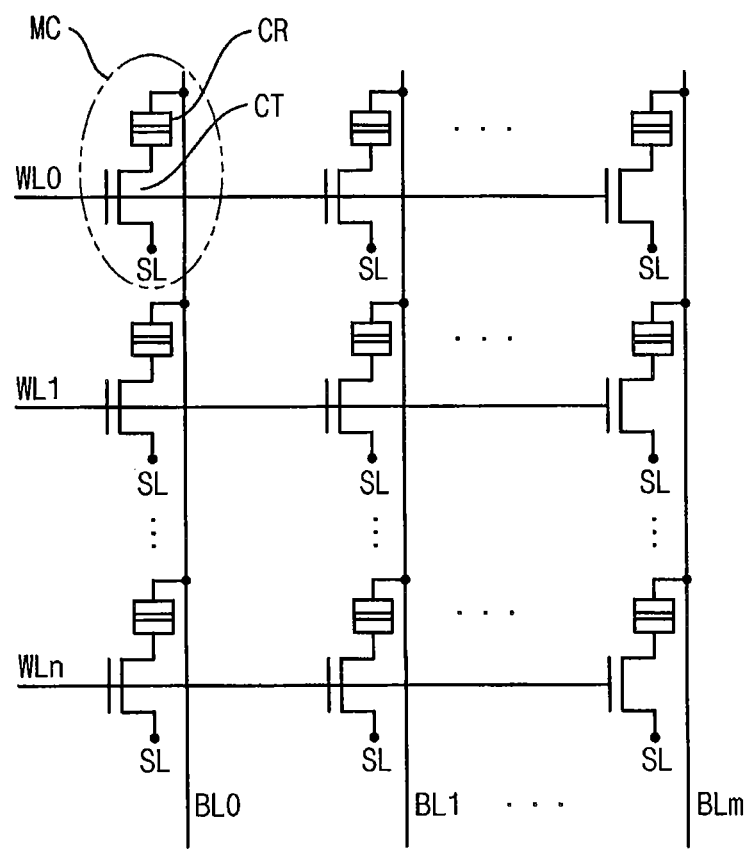

FIGS. 12 through 15 are diagrams illustrating examples of memory cell arrays that might be incorporated in the nonvolatile memory device of FIG. 11. FIG. 12 is a circuit diagram illustrating a memory cell array included in a NOR flash memory device. FIG. 13 is a circuit diagram illustrating a memory cell array included in a NAND flash memory device. FIG. 14 is a circuit diagram illustrating a memory cell array included in a vertical flash memory device. FIG. 15 is a circuit diagram illustrating a memory cell array in a resistive memory device.

Referring to FIG. 12, a memory cell array 410a may include a plurality of memory cells MC1. Memory cells in the same column may be connected in parallel between one of bit-lines BL(1), . . . , BL(m) and a common source line CSL. Memory cells in the same row may be commonly connected to the same word-line among word-lines WL(1), . . . , WL(n). For example, memory cells in a first column may be connected in parallel between a first bit-line BL(1) and the common source line CSL. Memory cells in a first row may be commonly connected to a first word-line WL(1). The memory cells MC1 may be controlled by a voltage on the word-lines WL(1), . . . , WL(n). In the NOR flash memory device including the memory cell array 100a, a read operation and a program operation may be performed per byte or word, and an erase operation may be performed per block 412a.

Referring to FIG. 13, the memory cell array 410b may include string select transistors SST, ground select transistors GST and a plurality of memory cells MC2. The string select transistors SST may be connected to bit-lines BL(1), . . . , BL(m), and the ground select transistors GST may be connected to a common source line CSL. The memory cells MC2 may be connected in series between the string select transistors SST and the ground select transistors GST. Memory cells in the same row may be connected to the same word-line among word-lines WL(1), . . . , WL(n). For example, 16, 32 or 64 word-lines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the word-lines WL(1), . . . , WL(n).

In the NAND flash memory device including the memory cell array 410b, a read operation and a program operation may be performed per page 411b, and an erase operation may be performed per block 412b. In this case, the odd-numbered bit-lines may form odd-numbered pages, the even-numbered bit-lines may form even-numbered pages, and program operations for the odd-numbered pages and the even-numbered pages may be alternately performed.

Referring to FIG. 14, a memory cell array 410c may include a plurality of strings 413c each of which has a vertical structure. The plurality of strings 413c may be formed in a second direction D2 to define a string column, and a plurality of string columns may be formed in a third direction D3 to define a string array. Each string may include string select transistors SSTV, ground select transistors GSTV, and a plurality of memory cells MC3 that are formed in a first direction D1 and are connected in series between the string select transistors SSTV and the ground select transistors GSTV.

The string select transistors SSTV may be connected to bit-lines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same word-line among word-lines WL(1), WL(2), . . . , WL(n−1), WL(n). Each string select line and each ground select line may extend in the second direction D2, and the string select lines SSL11, . . . , SSL12 and the ground select lines GSL11, . . . , GSLi2 may be formed in the third direction D3. Each word-line may extend in the second direction D2, and the word-lines WL(1), . . . , WL(n) may be formed in the first direction D1 and the third direction D3. Each bit-line may extend in the third direction D3, and the bit-lines BL(1), . . . , BL(m) may be formed in the second direction D2. The memory cells MC3 may be controlled by a voltage on the word-lines WL(1), . . . , WL(n).

Similarly to the NAND flash memory device, in the vertical flash memory device including the memory cell array 410c, a read operation and a program operation may be performed per page, and an erase operation may be performed per block.

Although not illustrated in FIG. 14, according to some embodiments, two string select transistors included in a single string may be connected to a single string select line, and two ground select transistors included in the single string may be connected to a single ground select line. According to some embodiments, the single string may include one string select transistor and one ground select transistor.

Referring to FIG. 15, a memory cell array 410d includes a plurality of word-lines WL0~WLn, a plurality of bit-lines BL0~BLm and a plurality of memory cells MC respectively disposed in cross areas of the word-lines WL0~WL and the bit lines BL0~BLn. Each of the memory cells MC includes a cell transistor CT and a resistive element CR.

The cell transistor CT and the resistive element CR in each memory cell MC are coupled between a source line SL and one of the bit-lines BL0~BLn. Even though not illustrated in FIG. 15, a plurality of memory cells may be coupled to the common source line. In some embodiments, the memory cell array 410d may be partitioned to at least two cell regions and the cell regions may be coupled to the different source lines.

Figure 16:
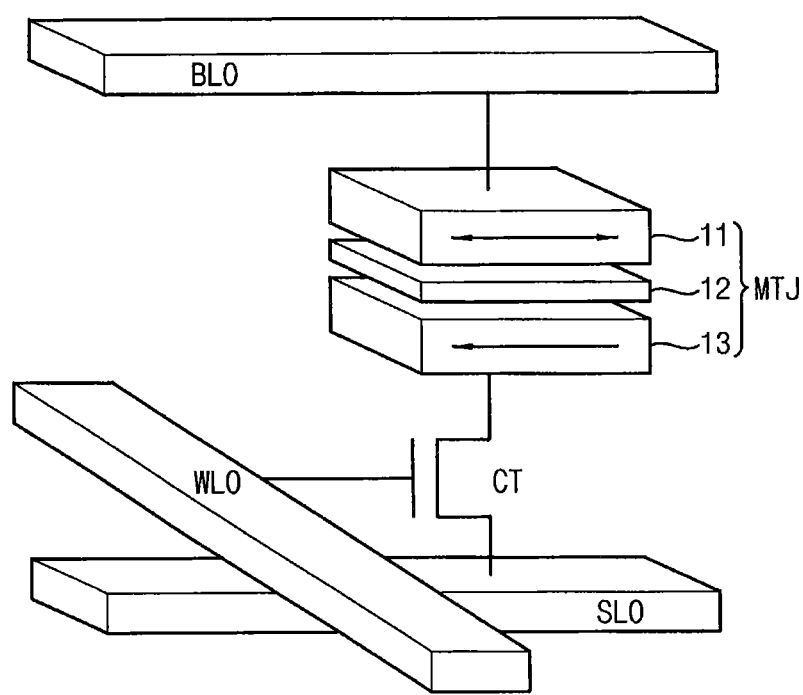
FIG. 16 is a diagram illustrating an example of a spin-transfer torque magneto-resistive random access memory (STT-MRAM) cell in the memory cell array of FIG. 16.

FIG. 16 is a diagram illustrating an example of a spin-transfer torque magneto-resistive random access memory (STT-MRAM) cell in the memory cell array of FIG. 16. Referring to FIG. 16, the STT-MRAM cell may include a magnetic tunnel junction (MTJ) element MTJ and a cell transistor CT. A gate of the cell transistor CT is coupled to a corresponding word line WL0, a first electrode of the cell transistor CT is coupled to a corresponding bit line BL0 via the MTJ element 420, and a second electrode of the cell transistor CT is coupled to a source line SL0.

The MTJ element MTJ may include a pinned layer 13, a free layer 11 and a barrier layer 12 between the free layer 11 and the pinned layer 13. The magnetization direction of the pinned layer 13 is fixed but the magnetization direction of the free layer 11 may be varied, according to the written data, between the same direction as or opposite direction to the magnetization direction of the pinned layer 13. In some embodiments, an anti-ferromagnetic layer may be further included in the MTJ element MTJ to enforce the magnetization direction of the pinned layer 13.

For example, to perform the write operation of the STT-MRAM cell, a high level voltage is applied to the word line WL0 to turn on the cell transistor CT, a write current is applied to flow from the bit line BL0 to the source line SL0.

For example, to perform the read operation of the STT-MRAM cell, a high level voltage is applied to the word line WL0 to turn on the cell transistor CT, a read current is applied to flow from the bit line BL0 to the source line SL0, and the resistance value is measured to determine the data stored in the MTJ element MTJ.

Figure 17:
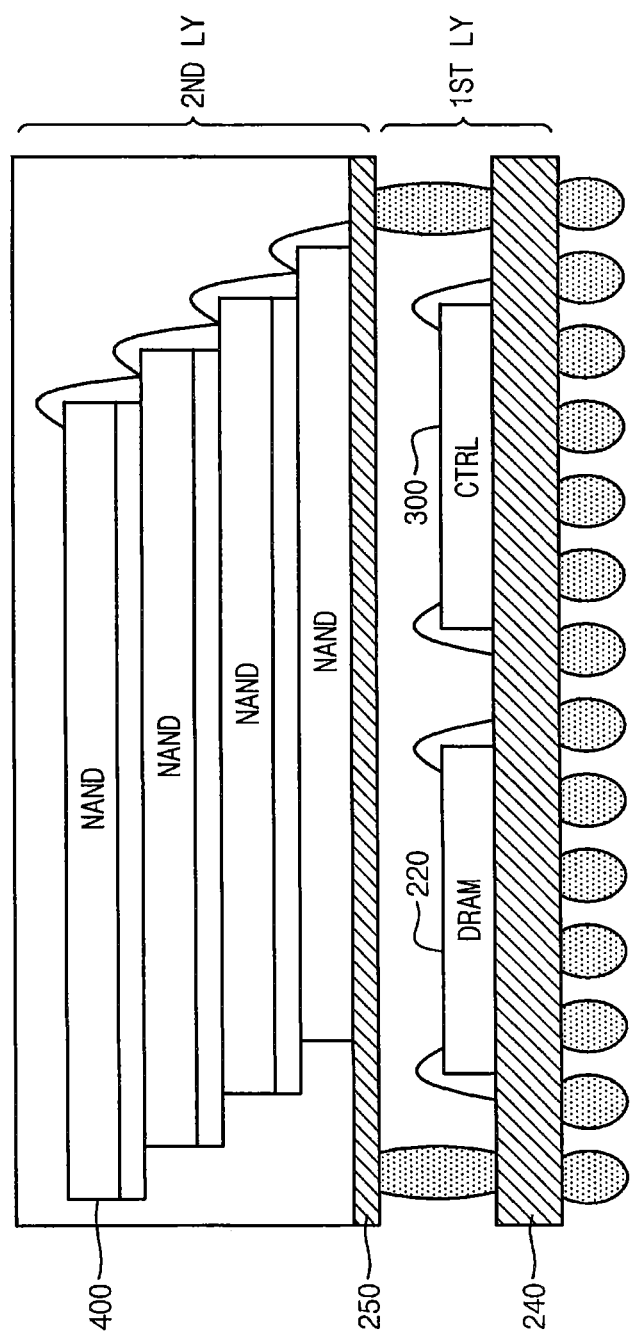
FIG. 17 is a cross sectional view illustrating a structure of SSD of FIG. 1 according to some example embodiments.

FIG. 17 is a cross sectional view illustrating a structure of SSD of FIG. 1 according to some example embodiments. In FIG. 17, nonvolatile memory devices 400 are implemented by NAND flash memories. Referring to FIG. 17, an SSD 200 may be provided in the laminated form of a first layer 1ST LY and a second layer 2ND LY.

The first layer 1ST LY may include the storage controller 300 and the DRAM 220 that are mounted on a first PCB substrate 240. The storage controller 300 writes data in nonvolatile memory devices 400 or reads data from the NAND flash memory 400 according to a command of the host device 100. The DRAM 220 is provided as a buffer memory of the SSD 200 and/or a working memory of the SSD 200.

The second layer 2ND LY may include the nonvolatile memory devices 400 mounted on a second PCB substrate 250. The nonvolatile memory devices 400 may have a laminated structure of stair form for routing. The nonvolatile memory devices 400 store data in response to a control of the storage controller 300. The nonvolatile memory devices 400 may include the nonvolatile memory devices 400a~400k in FIG. 1.

Figure 18:
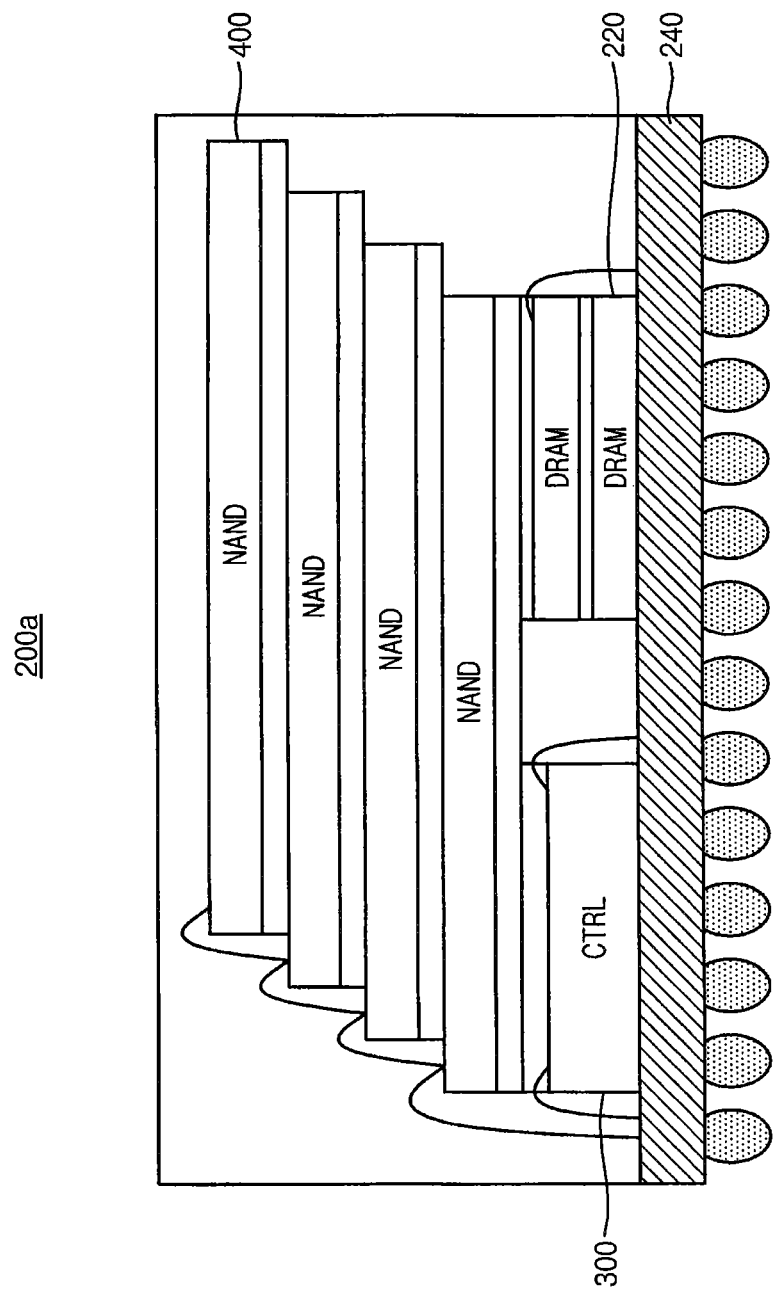
FIGS. 18 and 19 are cross sectional views illustrating examples of structure of the SSD of FIG. 17.
Figure 19:
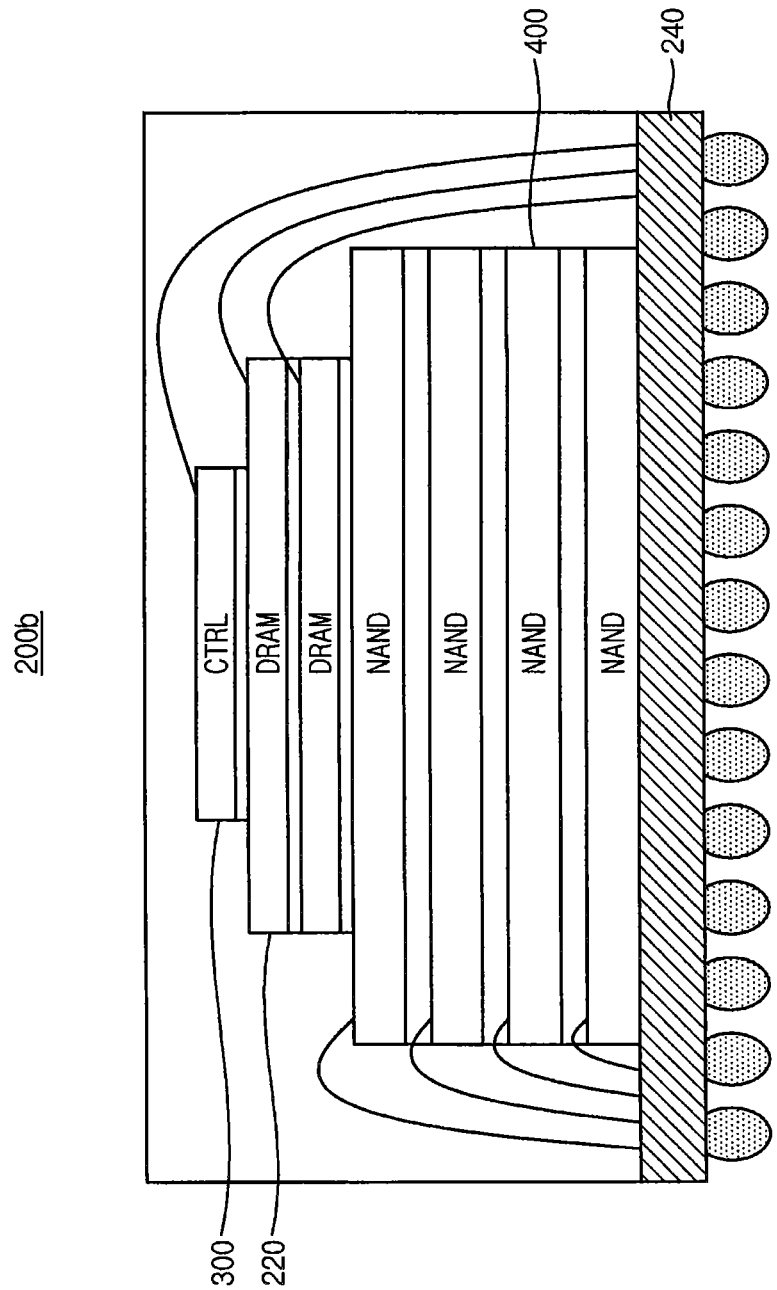

FIGS. 18 and 19 are cross sectional views illustrating examples of structures of the SSD of FIG. 17. As illustrated in FIGS. 18 and 19, the SSD 200a and 200b may include one PCB substrate 240 and all devices are stacked on a single substrate. The SSD 200a and 200b of FIGS. 18 and 19 is similar to the structure of the SSD 200 of FIG. 18. Thus, like reference numerals refer to like elements throughout.

Referring to FIG. 18, the SSD 200a includes a single PCB substrate 240, and the storage controller 300 and the DRAM 220 may be mounted on the PCB substrate 240. The nonvolatile memories 400 may be stacked on the storage controller 300 and the DRAM 220. In this case, the storage controller 300, the DRAM 220 and the nonvolatile memory devices 400 are connected to the PCB substrate 240 by a wire bonding.

Referring to FIG. 19, the SSD 200b includes a single substrate 240 and the nonvolatile memory devices 400 may be mounted on the PCB substrate 240. The DRAM 220 and the storage controller 300 may be mounted on the nonvolatile memory devices 400.

Figure 20:
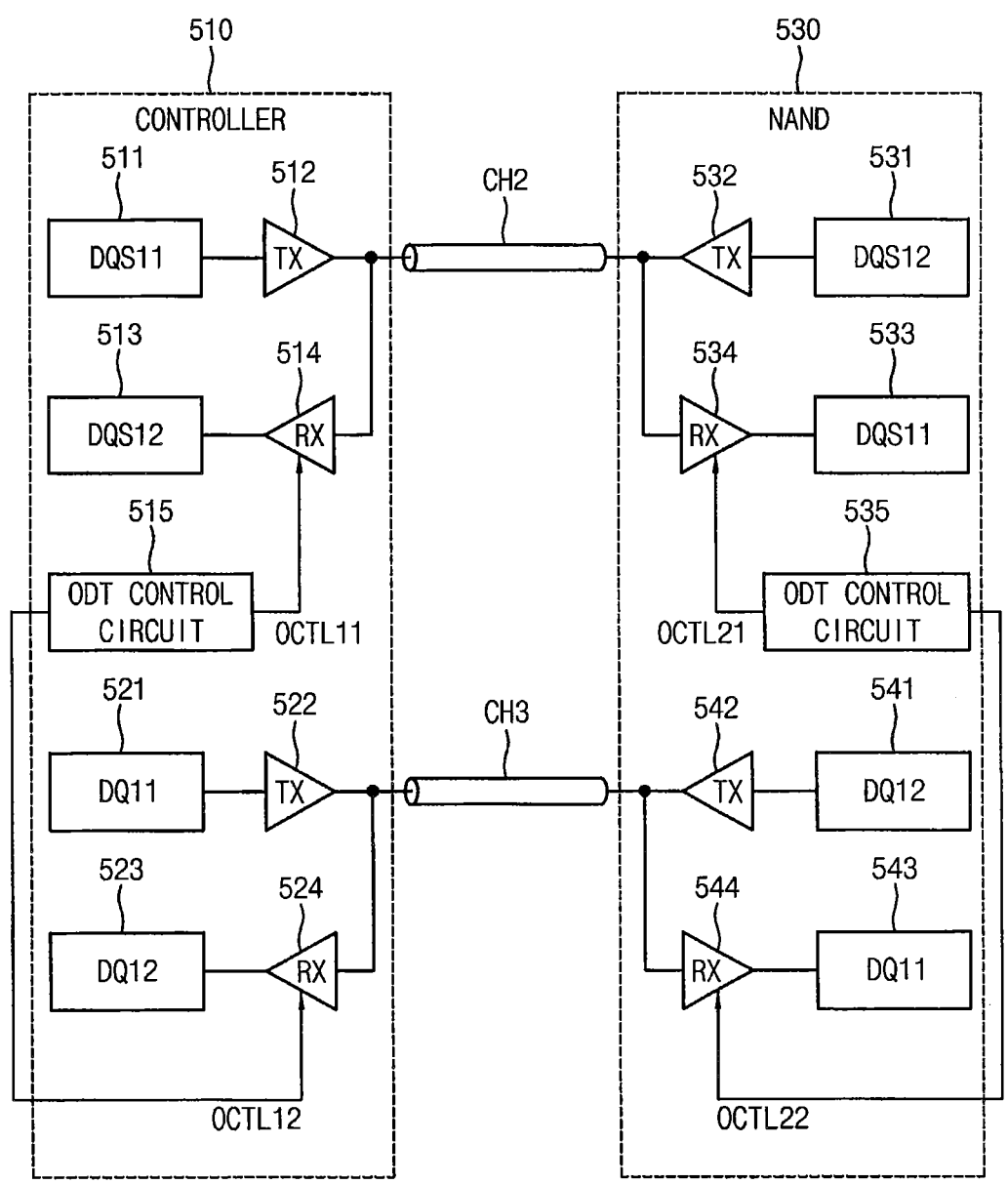
FIG. 20 illustrates an SSD according to some example embodiments.

FIG. 20 illustrates an SSD according to some example embodiments. Referring to FIG. 20, an SSD 500 may include a storage controller 510 and at least one nonvolatile memory device 530. The SSD 500 may support a single-ended signaling interface through channels CH2 and CH3 coupled between the storage controller 510 and at least one nonvolatile memory device 530.

The storage controller 510 includes a data strobe signal output buffer 511, a transmitter 512, a data strobe signal input buffer 513, a receiver 514, an ODT control circuit 515, a data output buffer 521, a transmitter 522, a data input buffer 523, and a receiver 524.

The nonvolatile memory device 530 includes a data strobe signal output buffer 531, a transmitter 532, a data strobe signal input buffer 533, a receiver 534, an ODT control circuit 535, a data output buffer 541, a transmitter 542, a data input buffer 543, and a receiver 544.

A data strobe signal DQS11 stored in the data strobe signal output buffer 511 may be stored in the data strobe signal input buffer 533 via the transmitter 512, the channel CH2 and the receiver 534. A data strobe signal DQS12 stored in the data strobe signal output buffer 531 may be stored in the data strobe signal input buffer 513 via the transmitter 532, the channel CH2 and the receiver 514.

Data DQ11 stored in the data output buffer 521 may be stored in the data input buffer 543 via the transmitter 522, the channel CH3 and the receiver 544. Data DQ12 stored in the data output buffer 541 may be stored in the data input buffer 523 via the transmitter 542, the channel CH3 and the receiver 524.

The receiver 514 may include the first ODT circuit 380a in FIG. 6, the receiver 524 may include the second ODT circuit 390 in FIG. 6, and the ODT control circuit 515 may include the ODT control circuit 370 in FIG. 6. The ODT control circuit 515 may provide a first ODT control signal OCTL11 to the first ODT circuit in the receiver 514 and may provide a second ODT control signal OCTL12 to the second ODT circuit in the receiver 524. The ODT control circuit 515 may activate the first ODT circuit in the receiver 514 and deactivate the second ODT circuit in the receiver 524 during the reception operation in which the storage controller 510 receives the data DQ12 and the data strobe signal DQS12 from the nonvolatile memory device 530. Therefore, the SSD 500 may reduce power consumption in the data reception operation.

The ODT control circuit 535 may provide a first ODT control signal OCTL21 to the first ODT circuit in the receiver 534 and may provide a second ODT control signal OCTL22 to the second ODT circuit in the receiver 544. The ODT control circuit 535 may activate the first ODT circuit in the receiver 534 and the second ODT circuit and may provide corresponding termination resistances to the data line and the strobe signal line when receiving the data DQ11 and the data strobe signal DQS11.

The storage controller 510 and the nonvolatile memory device 530 may be further coupled to each other through the channel CH1 in FIG. 4. The storage controller 510 may transmit the command CMD and the address ADDR to the nonvolatile memory device 530 via the channel CH1 based on the single-ended signaling interface.

Figure 21:
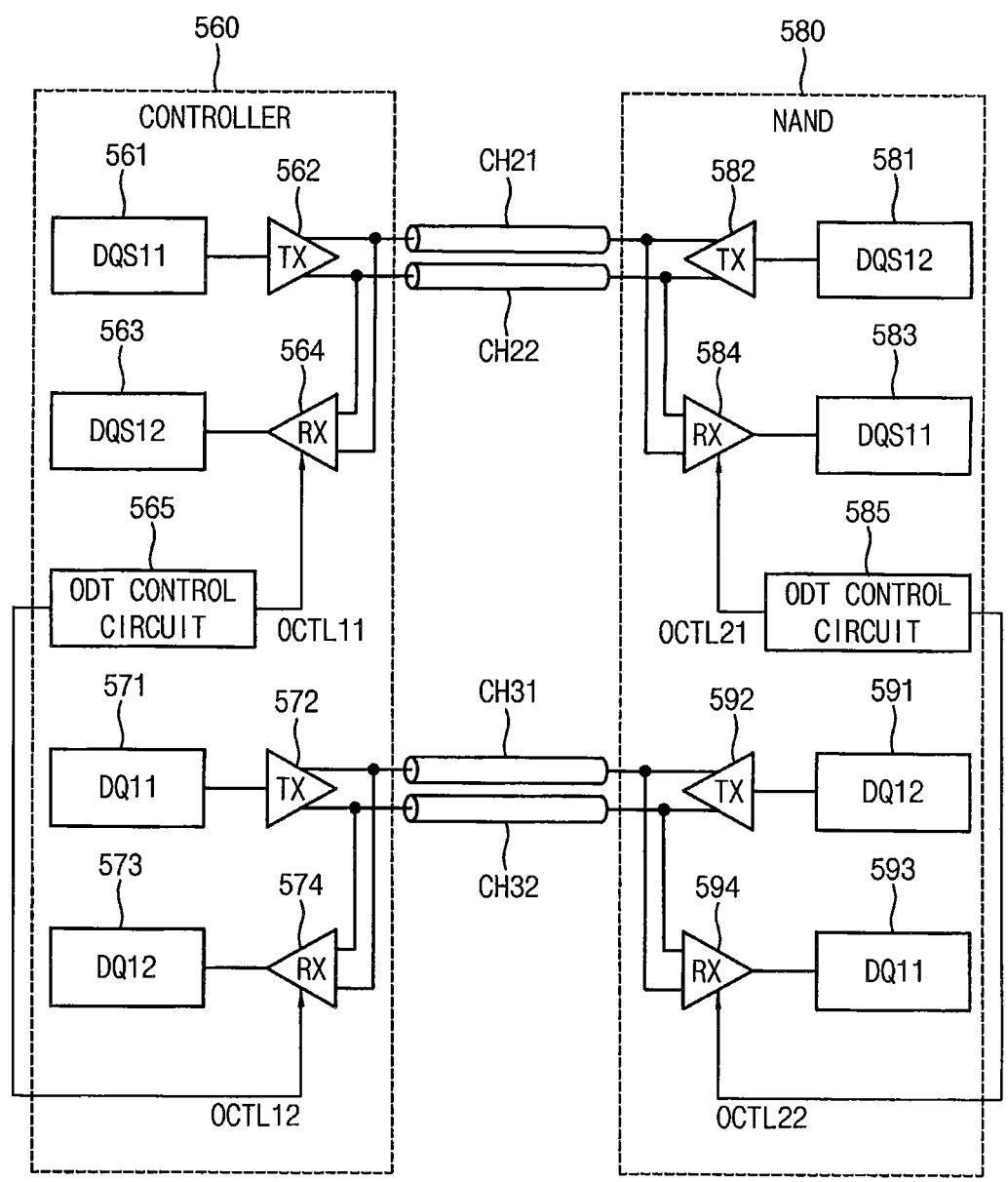
FIG. 21 illustrates an SSD according to some example embodiments.

FIG. 21 illustrates an SSD according to some example embodiments. Referring to FIG. 21, an SSD 550 may include a storage controller 560 and at least one nonvolatile memory device 580. The SSD 550 may support a differential signaling interface through channels CH21, CH22, CH31 and CH32 coupled between the storage controller 560 and at least one nonvolatile memory device 580.

The storage controller 560 includes a data strobe signal output buffer 561, a transmitter 562, a data strobe signal input buffer 563, a receiver 564, an ODT control circuit 565, a data output buffer 571, a transmitter 572, a data input buffer 573, and a receiver 574.

The nonvolatile memory device 580 includes a data strobe signal output buffer 581, a transmitter 582, a data strobe signal input buffer 583, a receiver 584, an ODT control circuit 585, a data output buffer 591, a transmitter 592, a data input buffer 593, and a receiver 594.

A data strobe signal DQS11 stored in the data strobe signal output buffer 561 may be stored in the data strobe signal input buffer 583 via the transmitter 562, the channels CH21 and CH22 and the receiver 584. A data strobe signal DQS12 stored in the data strobe signal output buffer 581 may be stored in the data strobe signal input buffer 563 via the transmitter 582, the channels CH21 and CH22 and the receiver 564.

Data DQ11 stored in the data output buffer 571 may be stored in the data input buffer 593 via the transmitter 572, the channels CH31 and CH32 and the receiver 594. Data DQ12 stored in the data output buffer 591 may be stored in the data input buffer 573 via the transmitter 592, the channels CH31 and CH32 and the receiver 574.

The receiver 564 may include the first ODT circuit 380*a* in FIG. 6, the receiver 574 may include the second ODT circuit 390 in FIG. 6, and the ODT control circuit 565 may include the ODT control circuit 370 in FIG. 6. The ODT control circuit 565 may provide a first ODT control signal OCTL11 to the first ODT circuit in the receiver 564 and may provide a second ODT control signal OCTL12 to the second ODT circuit in the receiver 574. The ODT control circuit 565 may activate the first ODT circuit in the receiver 564 and deactivate the second ODT circuit in the receiver 574 during the reception operation in which the storage controller 560 receives the data DQ12 and the data strobe signal DQS12 from the nonvolatile memory device 580. Therefore, the SSD 550 may reduce power consumption in the data reception operation.

The ODT control circuit 585 may provide a first ODT control signal OCTL21 to the first ODT circuit in the receiver 584 and may provide a second ODT control signal OCTL22 to the second ODT circuit in the receiver 594. The ODT control circuit 585 may activate the first ODT circuit in the receiver 584 and the second ODT circuit and may provide corresponding termination resistances to the data line and the strobe signal line when receiving the data DQ11 and the data strobe signal DQS11.

The storage controller 560 and the nonvolatile memory device 580 may be further coupled to each other through the channel CH1 in FIG. 4. The storage controller 560 may transmit the command CMD and the address ADDR to the nonvolatile memory device 580 via the channel CH1 based on the differential signaling interface.

Figure 22:
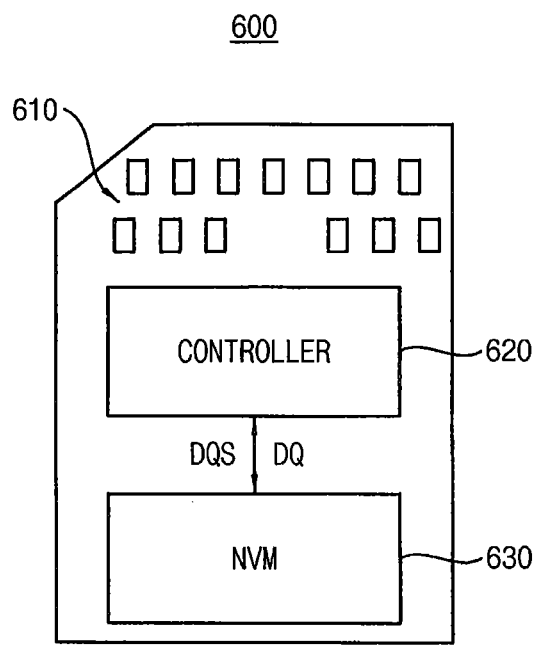
FIG. 22 is a block diagram illustrating a memory card that may incorporate a storage controller according to some example embodiments.

FIG. 22 is a block diagram illustrating a memory card that may incorporate a storage controller according to some example embodiments. Referring to FIG. 22, a memory card 600 may include a plurality of connecting pins 610, a storage controller 620 and at least one nonvolatile memory device 630.

The connecting pins 610 may be coupled to the host device 100 to transfer signals between the host device 100 and the memory card 600. The connecting pins 610 may include a clock pin, a command pin, a data pin and/or a reset pin.

The storage controller 620 may receive data from the host device 100, and may store the received data in the nonvolatile memory device 630. The storage controller 620 may include an ODT control circuit, a first ODT circuit and a second ODT circuit as illustrated in FIG. 6. Therefore, the storage controller 620 may reduce power consumption in data reception operation when receiving data DQ and data strobe signal DQS from the nonvolatile memory device 630 by activating the first ODT circuit that provides a termination resistance to a strobe signal line transferring the data strobe signal DQS and deactivating the second ODT circuit that provides a termination resistance to a data line transferring the data DQ.

For example, the memory card 600 may include a multimedia card (MMC), an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

The memory card 600 may be coupled to a host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 23:
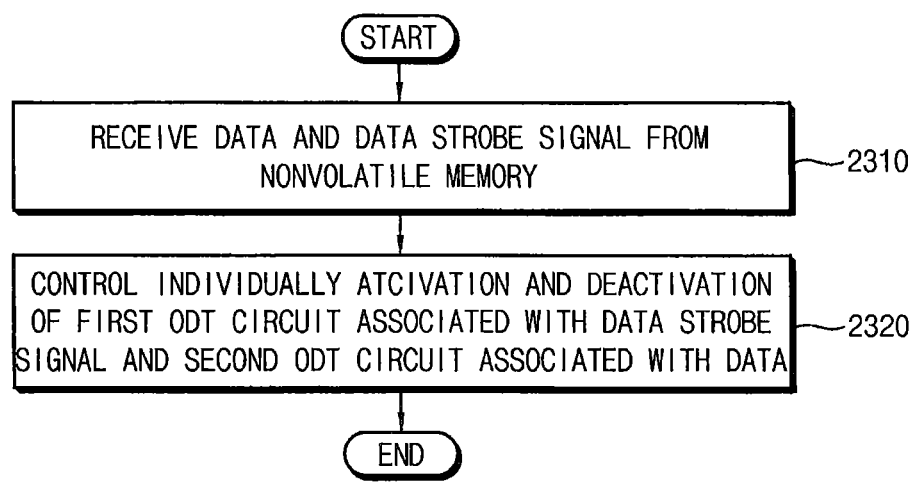
FIG. 23 is a flow chart illustrating a method of operating a storage controller according to some example embodiments.

FIG. 23 is a flow chart illustrating methods of operating a storage controller according to some example embodiments.

Referring to FIGS. 1 through 10 and 23, the storage controller 100 receives the data DQ and the data strobe signal DQS from the nonvolatile memory device 400*a* (block 2310). The data strobe signal DQS may provide a reference time point for determining logic level of the data DQ. When data DQ are exchanged with very high speed, the data strobe signal DQS may provide accurate reference time for determining the logic level of the data.

The ODT control circuit 370 may individually control activation and deactivation of the first ODT circuit 380*a* associated with the data strobe signal DQS and the second ODT circuit 390 associated with the data DQ (block 2320). The control circuit 370 may individually control the activation and the deactivation of the first ODT circuit 380*a* that provides a termination resistance to the strobe signal line transferring the data strobe signal DQS and the second ODT circuit 390 that provides a termination resistance to the data line transferring the data DQ.

Figure 24:
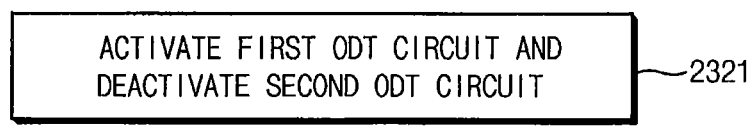
FIG. 24 illustrates the operation 2320 in FIG. 23.

FIG. 24 illustrates operation 2320 in FIG. 23.

For individually controlling the first ODT circuit 380*a* and the second ODT circuit 390, the ODT control circuit 370 may provide the first ODT control signal OCTL1 to the first ODT circuit 380*a* and may provide the second ODT control signal OCTL2 to the second ODT circuit 390 in response to the mode signal MS to activate the first ODT circuit 380*a* and to deactivate the second ODT circuit 390 in the reception operation in which the storage controller 300 receives the data DQ from the nonvolatile memory device 400*a* (block 2321). When the first ODT circuit 380*a* is activated and the second ODT circuit 390 is deactivated, the first ODT circuit 380*a* provides a corresponding termination resistance to the strobe signal line SSL and the second ODT circuit 390 does not provide the termination resistance to the data line DL during the reception operation. Therefore, a first voltage swing range 365 of the data strobe signal DQS may be smaller than a second voltage swing range 367 of the data DQ as described with reference to FIG. 10. In addition, since the second ODT circuit 390 is deactivated, current paths between the power supply voltage VDD and the ground voltage in the second ODT circuit 390 are blocked and power consumption that may occur in the reception operation may be reduced.

Figure 25:
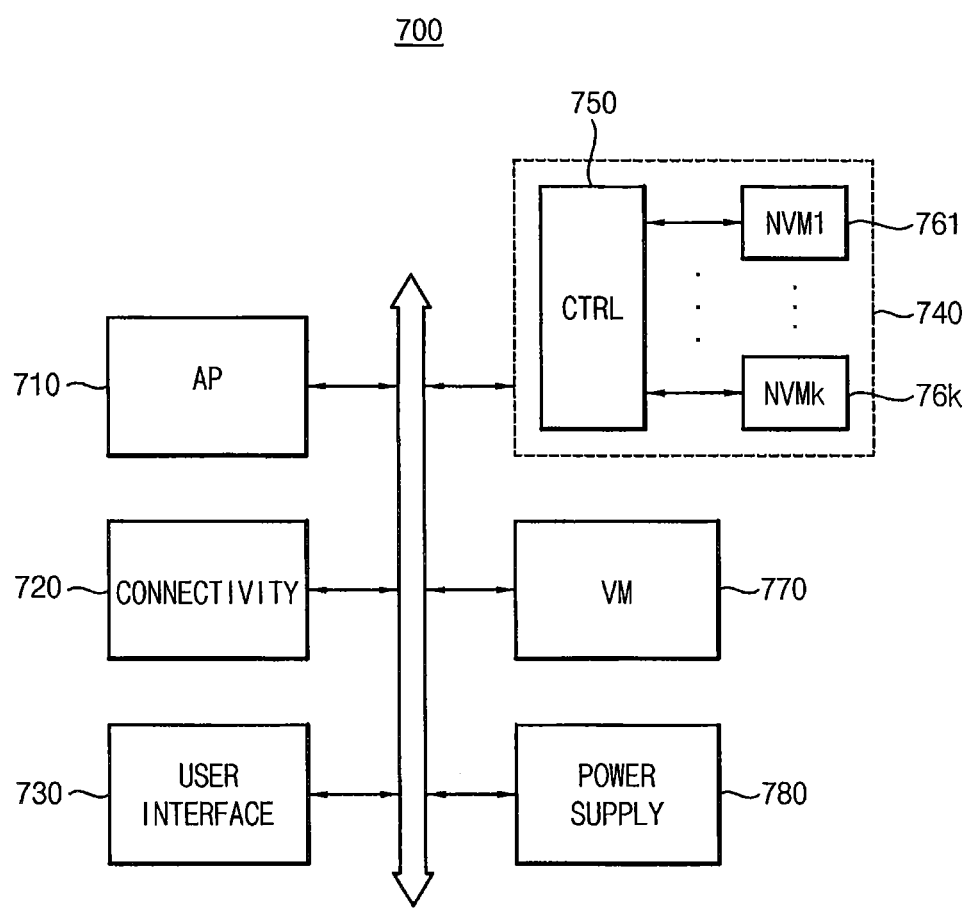
FIG. 25 is a block diagram illustrating a mobile device including the SSD according to some example embodiments.

FIG. 25 is a block diagram illustrating a mobile device including the SSD according to some example embodiments. Referring to FIG. 25, a mobile device 700 may include an application processor 710, a connectivity unit 720, an SSD 740, a volatile memory device 770, a user interface 730 and a power supply 780. In some embodiments, the mobile device 700 may be a mobile phone, a smart phone, a personal digital assistant (PDA), a portable multimedia player (PMP), a digital camera, a music player, a portable game console, a navigation system, etc.

The application processor 710 may execute applications, such as a web browser, a game application, a video player, etc. In some embodiments, the application processor 710 may include a single core or multiple cores. For example, the application processor 710 may be a multi-core processor, such as a dual-core processor, a quad-core processor, a hexa-core processor, etc. The application processor 710 may include an internal or external cache memory.

The connectivity unit 720 may perform wired and/or wireless communication with an external device. For example, the connectivity unit 720 may perform Ethernet communication, near field communication (NFC), radio frequency identification (RFID) communication, mobile telecommunication, memory card communication, universal serial bus (USB) communication, etc. In some embodiments, the connectivity unit 720 may include a baseband chipset that supports communications, such as global system for mobile communications (GSM), general packet radio service (GPRS), wideband code division multiple access (WCDMA), high speed downlink/uplink packet access (HSxPA), etc.

The volatile memory device 770 may store data processed by the application processor 710 or operate as a working memory. The volatile memory device 770 may be a DRAM, such as a double data rate synchronous dynamic random access memory (DDR SDRAM), a low power double data rate synchronous dynamic random access memory (LPDDR SDRAM), a graphics double data rate synchronous dynamic random access memory (GDDR SDRAM), a Rambus dynamic random access memory (RDRAM), etc.

The SSD 740 may store a boot image for booting the mobile device 700. For example, the SSD 740 may include a controller 750 and a plurality of nonvolatile memory devices 761~76*k*. The controller 750 may control the nonvolatile memory devices 761~76*k*. The controller 750 may include an ODT control circuit, a first ODT circuit and a second ODT circuit as illustrated in FIG. 6. Therefore, the controller 750 may reduce power consumption in data reception operation when receiving data and data strobe signal from at least one of the nonvolatile memory devices 761~76*k* by activating the first ODT circuit that provides a termination resistance to a strobe signal line transferring the data strobe signal and deactivating the second ODT circuit that provides a termination resistance to a data line transferring the data. For example, each of the nonvolatile memory devices 761~76*k* may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 730 may include at least one input device, such as a keypad, a touch screen, etc., and at least one output device, such as a speaker, a display device, etc. The power supply 780 may supply a power supply voltage to the mobile device 700. In some embodiments, the mobile device 700 may further include a camera image processor (CIS), and/or a storage device, such as a memory card, a solid state drive (SSD), a hard disk drive (HDD), a CD-ROM, etc.

In some embodiments, the mobile device 700 and/or components of the mobile device 700 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 26:
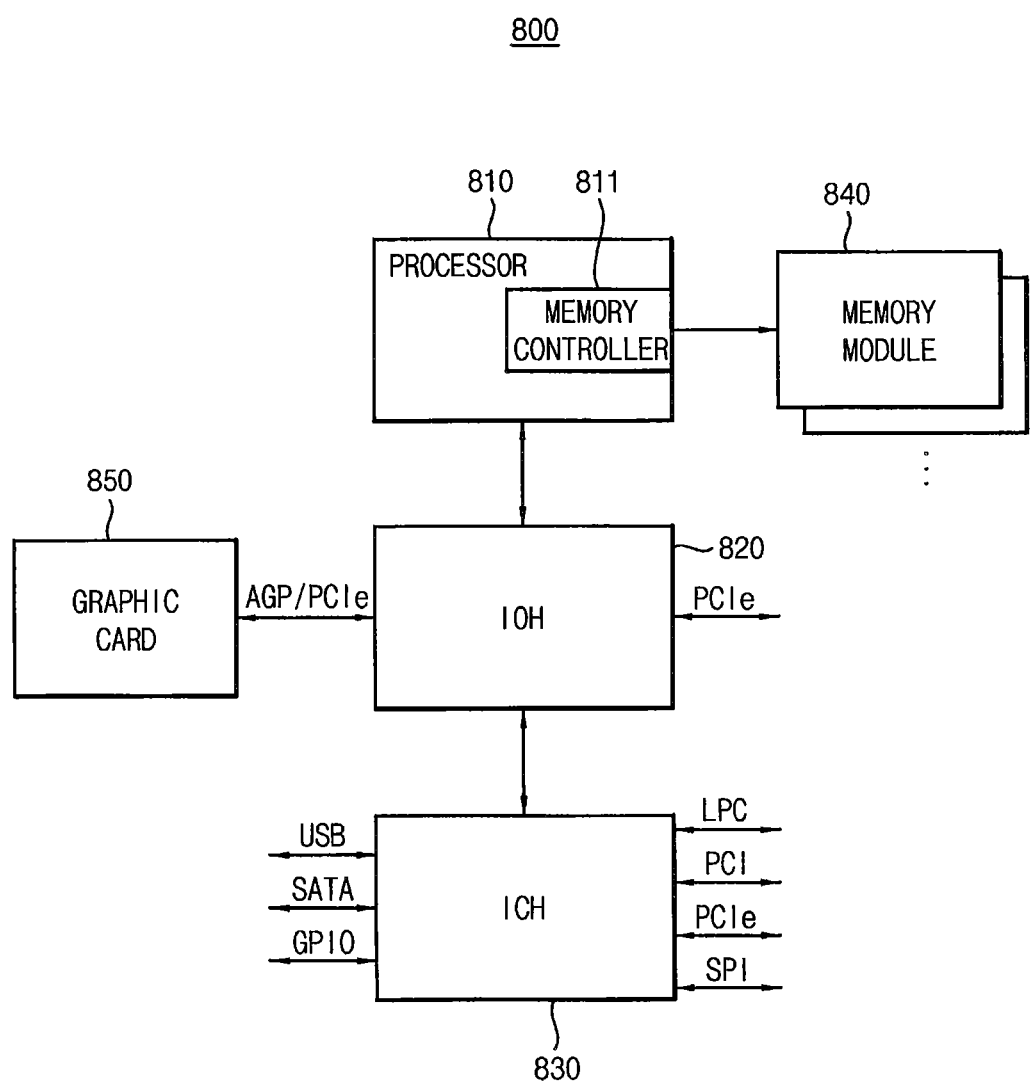
FIG. 26 is a block diagram illustrating a computing system including the SSD according to some example embodiments.

FIG. 26 is a block diagram illustrating a computing system including the SSD according to some example embodiments. Referring to FIG. 26, a computing system 800 may include a processor 810, an input/output hub (IOH) 820, an input/output controller hub (ICH) 830, at least one storage (e.g., one or more memory modules) 840 and a graphics card 850. In some embodiments, the computing system 800 may be a personal computer (PC), a server computer, a workstation, a laptop computer, a mobile phone, a smart phone, a personal digital assistant (PDA), a portable multimedia player (PMP), a digital camera, a digital television, a set-top box, a music player, a portable game console, a navigation system, etc.

The processor 810 may perform various computing functions, such as executing specific software for performing specific calculations or tasks. For example, the processor 810 may be a microprocessor, a central process unit (CPU), a digital signal processor, or the like. In some embodiments, the processor 810 may include a single core or multiple cores. For example, the processor 810 may be a multi-core processor, such as a dual-core processor, a quad-core processor, a hexa-core processor, etc. Although FIG. 26 illustrates the computing system 800 including one processor 810, in some embodiments, the computing system 800 may include a plurality of processors. The processor 810 may include an internal or external cache memory.

The processor 810 may include a controller 811 for controlling operations of the storage 840. The controller 811 included in the processor 810 may be referred to as an integrated memory controller (IMC). An interface between the controller 811 and the storage 840 may be implemented with a single channel including a plurality of signal lines, or may be implemented with multiple channels, to each of which at least one storage 840 may be coupled. In some embodiments, the controller 811 may be located inside the input/output hub 820, which may be referred to as a memory controller hub (MCH).

The storage 840 may include a plurality of nonvolatile memory devices that store data provided from the controller 811. The controller 811 may include an ODT control circuit, a first ODT circuit and a second ODT circuit as illustrated in FIG. 6. Therefore, the controller 811 may reduce power consumption in data reception operation when receiving data and data strobe signal from the storage 840 by activating the first ODT circuit that provides a termination resistance to a strobe signal line transferring the data strobe signal and deactivating the second ODT circuit that provides a termination resistance to a data line transferring the data.

The input/output hub 820 may manage data transfer between the processor 810 and devices, such as the graphics card 850. The input/output hub 820 may be coupled to the processor 810 via various interfaces. For example, the interface between the processor 810 and the input/output hub 820 may be a front side bus (FSB), a system bus, a HyperTransport, a lightning data transport (LDT), a QuickPath interconnect (QPI), a common system interface (CSI), etc. Although FIG. 26 illustrates the computing system 800 including one input/output hub 820, in some embodiments, the computing system 800 may include a plurality of input/output hubs. The input/output hub 820 may provide various interfaces with the devices. For example, the input/output hub 820 may provide an accelerated graphics port (AGP) interface, a peripheral component interface-express (PCIe), a communications streaming architecture (CSA) interface, etc.

The graphics card 850 may be coupled to the input/output hub 820 via AGP or PCIe. The graphics card 850 may control a display device (not shown) for displaying an image. The graphics card 850 may include an internal processor for processing image data and an internal semiconductor memory device. In some embodiments, the input/output hub 820 may include an internal graphics device along with or instead of the graphics card 850 outside the input/output hub 820. The graphics device included in the input/output hub 820 may be referred to as integrated graphics. Further, the input/output hub 820 including the internal memory controller and the internal graphics device may be referred to as a graphics and memory controller hub (GMCH).

The input/output controller hub 830 may perform data buffering and interface arbitration in order to efficiently operate various system interfaces. The input/output controller hub 830 may be coupled to the input/output hub 820 via an internal bus, such as a direct media interface (DMI), a hub interface, an enterprise Southbridge interface (ESI), PCIe, etc. The input/output controller hub 830 may provide various interfaces with peripheral devices. For example, the input/output controller hub 830 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 810, the input/output hub 820 and the input/output controller hub 830 may be implemented as separate chipsets or separate integrated circuits. In other embodiments, at least two of the processor 810, the input/output hub 820 and the input/output controller hub 830 may be implemented as a single chipset.

Figure 27:
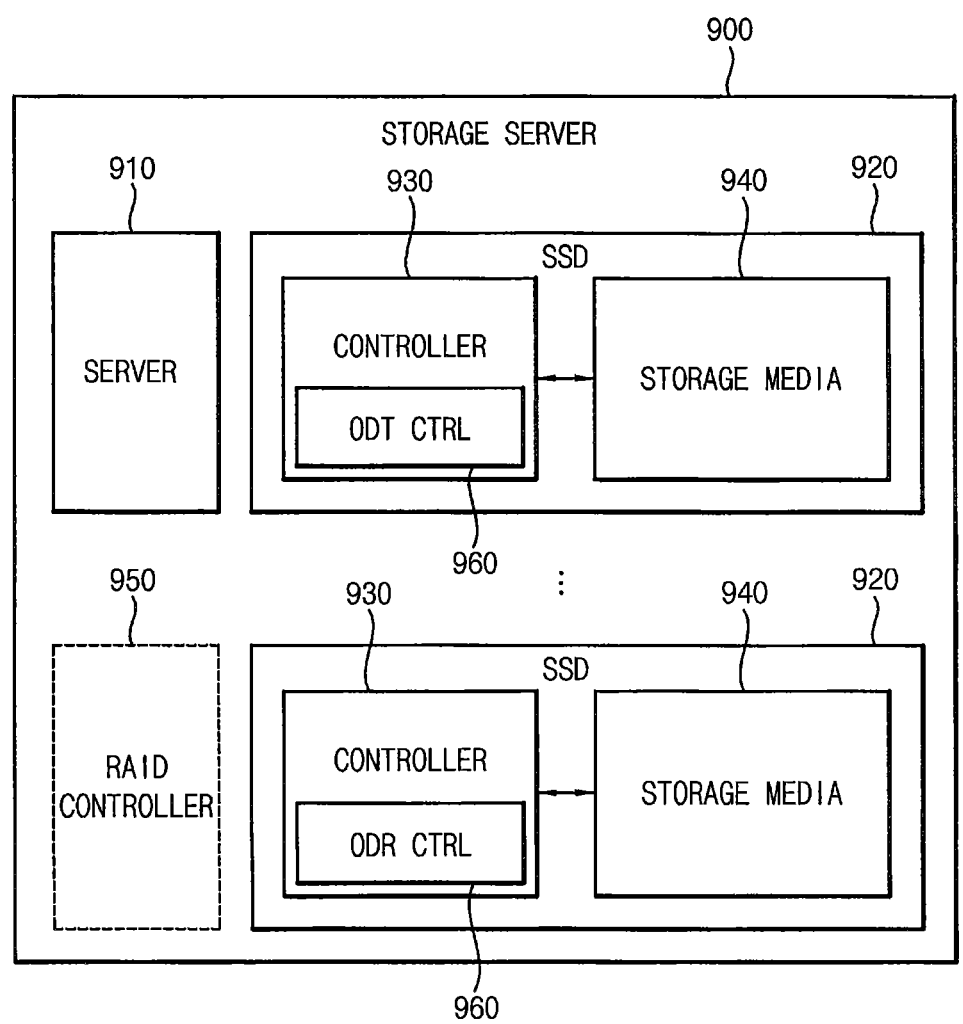
FIG. 27 is a block diagram illustrating an example of a storage server employing the SSD according to some example embodiments.

FIG. 27 is a block diagram illustrating an example of a storage server employing the SSD according to example embodiments. Referring to FIG. 27, a storage server 900 may includes a server 910, a plurality of SSDs 920, which store data for operating the server 910 and a raid controller 950 for controlling the SSDs 920. Redundant array of independent drives (RAID) techniques are mainly used in data servers where important data can be replicated in more than one location across a plurality a plurality of storage devices. The raid controller 950 may enable one of a plurality of RAID levels according to RAID information, and may interface data between the server 910 and the SSDs 920. Each of the SSDs 920 may include a storage media having a nonvolatile memory devices and a controller 930 for controlling the storage media 940. The SSD 920 may employ the SSD 200 in FIG. 1. The controller 930 of the SSD 920 may include an ODT control circuit 960. The controller 930 of the SSD 920 may further include a first ODT circuit and a second ODR circuit. Therefore, the controller 930 may reduce power consumption in data reception operation when receiving data and data strobe signal from the storage media 940 by activating the first ODT circuit that provides a termination resistance to a strobe signal line transferring the data strobe signal and deactivating the second ODT circuit that provides a termination resistance to a data line transferring the data.

FIG. 28 is a block diagram illustrating an example of a server system that employs the SSD according to some example embodiments. Referring to FIG. 28, a server system 1000 may include a server 1100 and an SSD 1200, which stores data for operating the server 1100.

The server 1100 includes an application communication module 1110, a data processing module 1120, an upgrading module 1130, a scheduling center 1140, a local resource module 1150, and a repair information module 1160.

The application communication module 1110 may be implemented for communicating between the server 1100 and a computing system connected to a network, or may be implemented for communicating between the server 1100 and the storage device 1200. The application communication module 1110 transmits data or information received through user interface to the data processing module 1120.

The data processing module 1120 is linked to the local resource module 1150. The local resource module 1150 may provide a user with repair shops, dealers and list of technical information based on the data or information input to the server 1100.

The upgrading module 1130 interfaces with the data processing module 1120. The upgrading module 1130 may upgrade firmware, reset code or other information to an appliance based on the data or information from the SSD 1200.

The scheduling center 1140 permits real-time options to the user based on the data or information input to the server 1100.

The repair information module 1160 interfaces with the data processing module 1120. The repair information module 1160 may provide the user with information associated with repair (for example, audio file, video file or text file). The data processing module 1120 may pack associated information based on information from the SSD 1200. The packed information may be sent to the SSD 1200 and/or may be displayed to the user.

The SSD 1200 may employ the SSD 200 in FIG. 1. The SSD 1200 may include a controller and a plurality of nonvolatile memory devices. The controller may include an ODT control circuit 1210. The controller may further include a first ODT circuit and a second ODR circuit. Therefore, the controller may reduce power consumption in data reception operation when receiving data and data strobe signal from the nonvolatile memory devices by activating the first ODT circuit that provides a termination resistance to a strobe signal line transferring the data strobe signal and deactivating the second ODT circuit that provides a termination resistance to a data line transferring the data.

The example embodiments are applicable to various systems using the SSD. Therefore, the example embodiments may be used in any system, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of embodiments and is not to be construed as limiting thereof. Although a few embodiments have been described, those skilled in the art will readily appreciate that many modifications are possible in the embodiments without materially departing from the scope of the inventive concept as set forth in the accompanying claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the claims.

What is claimed is:

1. A storage controller comprising:
   a first on-die termination (ODT) circuit that is configured to provide a first termination resistance with a strobe signal line that is configured to transfer a data strobe signal;
   a second ODT circuit that is configured to provide a second termination resistance with at least one data line that transfers data; and
   an ODT control circuit that is configured to individually control activation and deactivation of the first ODT circuit and the second ODT circuit,
   wherein the ODT control circuit activates the first ODT circuit and deactivates the second ODT circuit during a reception operation in which the storage controller receives the data from a nonvolatile memory device.

2. The storage controller of claim 1, wherein the ODT control circuit provides a first ODT control signal to the first ODT circuit to activate the first ODT circuit and provides a second ODT control signal to the second ODT circuit to deactivate the second ODT circuit, in response to receiving a mode signal.

3. The storage controller of claim 1, further comprising:
   an I/O circuit that receives the data and the data strobe signal,
   wherein the I/O circuit determines a logic value of the data based on the data strobe signal.

4. The storage controller of claim 3, wherein the I/O circuit is connected with the first ODT circuit via the strobe signal line and is connected with the second ODT circuit via the at least one data line.

5. The storage controller of claim 1, wherein the first ODT circuit comprises:
   a plurality of first resistors that are connected in parallel to the strobe signal line;
   a plurality of pull-up switches, connected between respective ones of the plurality of first resistors and a power supply voltage;
   a plurality of second resistors that are connected in parallel to the strobe signal line; and
   a plurality of pull-down switches, connected between respective ones of the plurality of second resistors and a ground voltage.

6. The storage controller of claim 5, wherein responsive to the ODT control circuit activating the first ODT circuit, the pull-up switches and the pull-down switches receive first ODT control codes that are set in response to a first ODT control signal.

7. The storage controller of claim 1, wherein the second ODT circuit comprises:
   a plurality of first resistors connected in parallel to the at least one data line;
   a plurality of pull-up switches, connected between respective ones of the plurality of first resistors and a power supply voltage;
   a plurality of second resistors connected in parallel to the at least one data line; and
   a plurality of pull-down switches connected between respective ones of the plurality of second resistors and a ground voltage.

8. The storage controller of claim 7, wherein responsive to the ODT control circuit deactivating the second ODT circuit, the pull-up switches and the pull-down switches are turned off in response to a second ODT control signal.

9. The storage controller of claim 1, wherein the ODT control circuit controls the first ODT circuit and the second ODT circuit such that a first voltage swing range of the data strobe signal is different from a second voltage swing range of the data.

10. A solid state disk (SSD) comprising:
    a plurality of nonvolatile memory devices that store data; and
    a storage controller that is configured to control the plurality of nonvolatile memory devices,
    wherein the storage controller comprises:
    a first on-die termination (ODT) circuit that is configured to provide a first termination resistance with a strobe signal line that is configured to transfer a data strobe signal;
    a second ODT circuit that is configured to provide a second termination resistance with at least one data line that transfers the data; and
    an ODT control circuit that is configured to individually control activation and deactivation of the first ODT circuit and the second ODT circuit,
    wherein the ODT control circuit activates the first ODT circuit and deactivates the second ODT circuit during a reception operation in which the storage controller receives the data from the plurality of nonvolatile memory devices.

11. The SSD of claim 10, wherein the storage controller exchanges the data strobe signal via a first channel and the data via a second channel and with one of the nonvolatile memory devices.

12. The SSD of claim 10, wherein each of the nonvolatile memory devices is a NAND flash memory, and at least one of the plurality of nonvolatile memory devices comprises a three-dimensional memory array.

13. The SSD of claim 10, wherein the storage controller further comprises:
    an input/output (I/O) circuit that is configured to receive the data strobe signal and the data, and
    wherein the I/O circuit is connected to the strobe signal line and the at least one data line.

14. A device comprising:
a storage controller that is configured to control a plurality of nonvolatile memory devices that are configured to store data,
the storage controller comprising:
a first on-die termination (ODT) circuit that is configured to provide a first termination resistance with a strobe signal line;
a second ODT circuit that is configured to provide a second termination resistance with at least one data line that transfers the data, wherein the first termination resistance is different than the second termination resistance during a reception operation in which the storage controller receives the data from the plurality of nonvolatile memory devices; and
an ODT control circuit that is configured to control activation and deactivation of the first ODT circuit and the second ODT circuit independently,
wherein the storage controller comprises:
a first receiver that includes the first ODT circuit and that receives the data strobe signal from a first channel; and
a second receiver that includes the second ODT circuit and that receives the data from a second channel.

15. The device of claim 14, wherein the storage controller exchanges the data strobe signal via a first channel and the data via a second channel and with one of the plurality of nonvolatile memory devices, and
wherein each of the first channel and the second channel provides a single-ended signaling interface.

16. The device of claim 14, wherein each of the first channel and the second channel provides a differential signaling interface.

17. The device of claim 14, wherein the ODT control circuit activates the first ODT circuit and deactivates the second ODT circuit during the reception operation.

* * * * *